(12) United States Patent
Manassen et al.

(10) Patent No.: US 11,300,405 B2
(45) Date of Patent: Apr. 12, 2022

(54) GREY-MODE SCANNING SCATTEROMETRY OVERLAY METROLOGY

(71) Applicant: KLA Corporation, Milpitas, CA (US)

(72) Inventors: Amnon Manassen, Haifa (IL); Andrew V. Hill, Berkeley, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/178,089

(22) Filed: Feb. 17, 2021

(65) Prior Publication Data

US 2022/0034652 A1 Feb. 3, 2022

Related U.S. Application Data

(60) Provisional application No. 63/144,205, filed on Feb. 1, 2021, provisional application No. 63/060,576, filed on Aug. 3, 2020.

(51) Int. Cl.
*G01B 11/27* (2006.01)
*G01B 9/02* (2006.01)
*G01B 9/02015* (2022.01)

(52) U.S. Cl.
CPC ........ *G01B 11/272* (2013.01); *G01B 9/02027* (2013.01); *G01B 9/02043* (2013.01)

(58) Field of Classification Search
CPC ....... G01B 11/14; G01B 11/27; G01B 11/272; G01B 9/02027; G01B 9/02043; H01L 22/12; H01L 23/544; G03F 7/70633
See application file for complete search history.

(56) References Cited

U.S. PATENT DOCUMENTS 7,808,638 B2 * 10/2010 Bevis .................. G01N 21/47
356/401
10,268,125 B2   4/2019 Peng et al.
(Continued)

FOREIGN PATENT DOCUMENTS

CN        104346808 A    2/2015
KR     20150121275 A    10/2015

OTHER PUBLICATIONS

U.S. Appl. No. 16/964,734, filed Jul. 24, 2020.
(Continued)

*Primary Examiner* — Michael A Lyons
(74) *Attorney, Agent, or Firm* — Suiter Swantz pc llo

(57) ABSTRACT

An overlay metrology system may include, an illumination sub-system, a collection sub-system and a controller. The illumination sub-system may include one or more illumination optics configured to direct an illumination beam to an overlay target on a sample as the sample is scanned along a stage-scan direction by a translation stage, where the overlay target includes one or more cells having a grating-over-grating structure with periodicity along the stage-scan direction. The collection sub-system may include an objective lens, a first photodetector located in a pupil plane at a location of overlap between 0-order diffraction and +1-order diffraction, and a second photodetector located in a pupil plane at a location of overlap between 0-order diffraction and −1-order diffraction. The controller may receive time-varying interference signals from the first and second photodetectors and determine an overlay error between the first and second layers of the sample along the stage-scan direction.

24 Claims, 14 Drawing Sheets

(56) References Cited

U.S. PATENT DOCUMENTS

| | | | |
|---|---|---|---|
| 2009/0262362 A1* | 10/2009 | de Groot | G01N 21/95607 |
| | | | 356/508 |
| 2016/0047744 A1 | 2/2016 | Adel et al. | |
| 2016/0223920 A1 | 8/2016 | Tinnemans et al. | |
| 2017/0268869 A1* | 9/2017 | Levinski | G01B 9/0201 |
| 2018/0052099 A1* | 2/2018 | Hill | G01J 3/12 |
| 2019/0004439 A1 | 1/2019 | Lubashevsky et al. | |
| 2019/0378737 A1* | 12/2019 | Gutman | G01B 11/272 |
| 2020/0132446 A1* | 4/2020 | Shalibo | G01N 21/9501 |
| 2020/0159129 A1* | 5/2020 | Manassen | G01B 11/272 |
| 2020/0409271 A1 | 12/2020 | Hill et al. | |

OTHER PUBLICATIONS

U.S. Appl. No. 17/140,999, filed Jan. 4, 2021, entitled Scanning Scatterometry Overlay Measurement.
U.S. Appl. No. 17/142,783, filed Jan. 6, 2021, entitled Pupil-Plane Beam Scanning for Metrology.
PCT International Search Report and Written Opinion for International Application No. PCT/US2021/044111 dated Nov. 22, 2022, 9 pages.

* cited by examiner

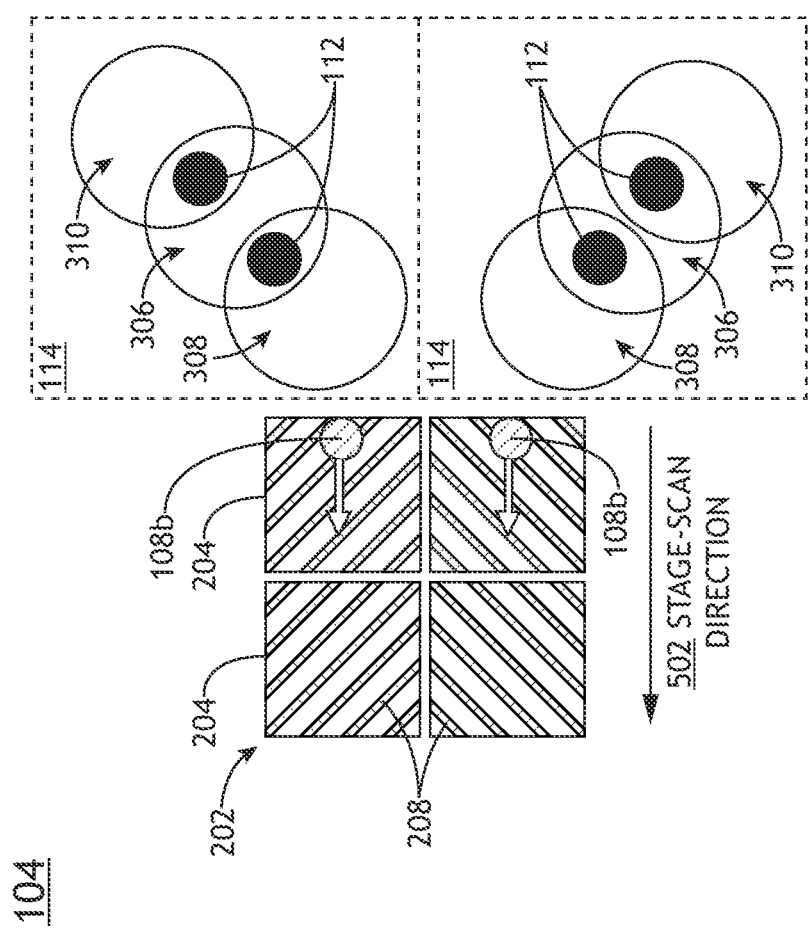

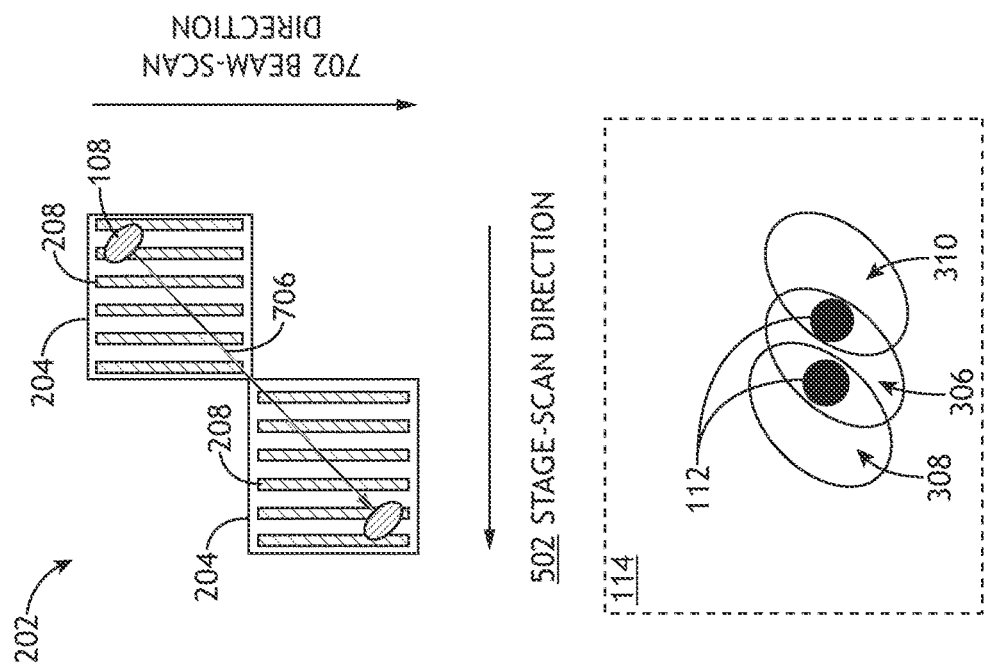
FIG. 7D
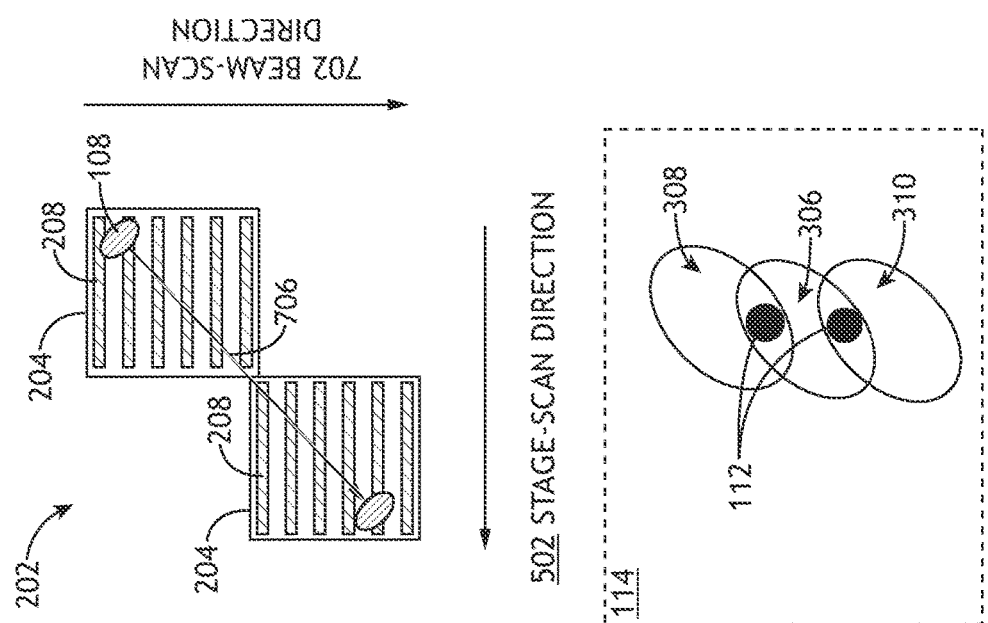
FIG. 7C
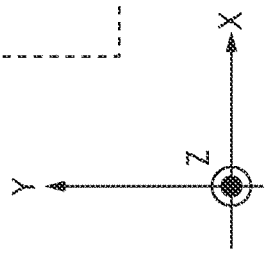

GREY-MODE SCANNING SCATTEROMETRY OVERLAY METROLOGY

CROSS-REFERENCE TO RELATED APPLICATION

The present application claims the benefit under 35 U.S.C. § 119(e) of U.S. Provisional Application Ser. No. 63/060,576 filed Aug. 3, 2020 and U.S. Provisional Application Ser. No. 63/144,205 filed Feb. 1, 2021, both of which are incorporated herein by reference in the entirety.

TECHNICAL FIELD

The present disclosure relates generally to overlay metrology and, more particularly, to grey-mode scanning scatterometry overlay metrology.

BACKGROUND

Overlay metrology generally refers to measurements of the relative alignment of layers on a sample such as, but not limited to, semiconductor devices. An overlay measurement, or a measurement of overlay error, typically refers to a measurement of the misalignment of fabricated features on two or more sample layers. In a general sense, proper alignment of fabricated features on multiple sample layers is necessary for proper functioning of the device.

Demands to decrease feature size and increase feature density are resulting in correspondingly increased demand for accurate and efficient overlay metrology. Metrology systems typically generate metrology data associated with a sample by measuring or otherwise inspecting dedicated metrology targets distributed across the sample. Accordingly, the sample is typically mounted on a translation stage and translated such that the metrology targets are sequentially moved into a measurement field of view. In typical metrology systems employing a move and measure (MAM) approach, the sample is static during each measurement. However, the time required for the translation stage to settle prior to a measurement may negatively impact the throughput. Therefore, it is desirable to provide systems and methods for curing the above deficiencies.

SUMMARY

An overlay metrology system is disclosed in accordance with one or more illustrative embodiments of the present disclosure. In one illustrative embodiment, the system includes an illumination sub-system. In another illustrative embodiment, the illumination sub-system includes an illumination source to generate an illumination beam. In another illustrative embodiment, the system includes one or more illumination optics configured to direct the illumination beam to an overlay target on a sample as the sample is scanned along a stage-scan direction by a translation stage, where the overlay target includes one or more cells having a grating-over-grating structure with periodicity along the stage-scan direction, and where the grating-over-grating structures include first-layer grating features on a first layer of the sample and second-layer grating features on a second layer of the sample in an overlapping region. In another illustrative embodiment, the system includes a collection sub-system. In another illustrative embodiment, the collection sub-system includes an objective lens. In another illustrative embodiment, the collection sub-system includes a first photodetector located in a pupil plane at a location of overlap between 0-order diffraction from the overlay target and +1-order diffraction from the overlay target. In another illustrative embodiment, the collection sub-system includes a second photodetector located in a pupil plane at a location of overlap between 0-order diffraction from the overlay target and −1-order diffraction from the overlay target. In another illustrative embodiment, the system includes a controller communicatively coupled to the first and second photodetectors. In another illustrative embodiment, the controller receives time-varying interference signals from the first and second photodetectors as the overlay target is scanned along the stage-scan direction. In another illustrative embodiment, the controller determines an overlay error between the first and second layers of the sample along the stage-scan direction based on the time-varying interference signals.

An overlay metrology system is disclosed in accordance with one or more illustrative embodiments of the present disclosure. In one illustrative embodiment, the system includes an illumination sub-system. In another illustrative embodiment, the illumination sub-system includes a first illumination channel and a second illumination channel for illuminating an overlay target on a sample with a first illumination beam and a second illumination beam as the sample is scanned along a stage-scan direction by a translation stage. In another illustrative embodiment, the overlay target includes one or more first cells having a grating-over-grating structure with periodicity along a first direction and one or more second cells having a grating-over-grating structure with periodicity along a second direction orthogonal to the first direction, wherein the stage-scan direction is angled with respect to the first direction and second direction. In another illustrative embodiment, a particular grating-over-grating structure includes first-layer grating features on a first layer of the sample and second-layer grating features on a second layer of the sample in an overlapping region. In another illustrative embodiment, the first and second illumination channels illuminate different cells of the overlay target separated along a direction orthogonal to the stage-scan direction. In another illustrative embodiment, the system includes a collection sub-system. In another illustrative embodiment, the collection sub-system includes an objective lens. In another illustrative embodiment, the collection sub-system includes a first detection channel and a second detection channel associated with the first illumination channel and the second illumination channel, respectively. In another illustrative embodiment, a particular detection channel includes a first photodetector located in a pupil plane at a location of overlap between 0-order diffraction from the overlay target and +1-order diffraction from the overlay target and a second photodetector located in a pupil plane at a location of overlap between 0-order diffraction from the overlay target and −1-order diffraction from the overlay target. In another illustrative embodiment, the system includes a controller communicatively coupled to the first and second photodetectors. In another illustrative embodiment, the controller receives time-varying interference signals from the first and second photodetectors of each of the first and second detection channels as the overlay target is scanned along the measurement direction. In another illustrative embodiment, the controller determines an overlay error between the first and second layers of the sample along the first and second directions based on the time-varying interference signals.

An overlay metrology system is disclosed in accordance with one or more illustrative embodiments of the present disclosure. In one illustrative embodiment, the system includes an illumination sub-system. In another illustrative embodiment, the illumination sub-system includes an illumination source configured to generate an illumination beam. In another illustrative embodiment, the illumination sub-system includes a scan mirror configured to scan the illumination beam along a beam-scan direction across an overlay target on a sample as the sample is translated along a stage-scan direction orthogonal to the beam-scan direction by a translation stage. In another illustrative embodiment, the overlay target includes one or more cells having a grating-over-grating structure with periodicity along a measurement direction. In another illustrative embodiment, the measurement direction corresponds to the beam-scan direction or the stage-scan direction. In another illustrative embodiment, the grating-over-grating structures include first-layer grating features on a first layer of the sample and second-layer grating features on a second layer of the sample in an overlapping region. In another illustrative embodiment, the system includes a collection sub-system. In another illustrative embodiment, the collection sub-system includes an objective lens. In another illustrative embodiment, the collection sub-system includes a first photodetector located in a pupil plane at a location of overlap between 0-order diffraction from the overlay target and +1-order diffraction from the overlay target. In another illustrative embodiment, the collection sub-system includes a second photodetector located in a pupil plane at a location of overlap between 0-order diffraction from the overlay target and −1-order diffraction from the overlay target. In another illustrative embodiment, the system includes a controller communicatively coupled to the first and second photodetectors. In another illustrative embodiment, the controller receives time-varying interference signals from the first and second photodetectors as the overlay target is scanned along the measurement direction. In another illustrative embodiment, the controller determines an overlay error between the first and second layers of the sample along the measurement direction based on the time-varying interference signals.

An overlay metrology system is disclosed in accordance with one or more illustrative embodiments of the present disclosure. In one illustrative embodiment, the system includes an illumination sub-system. In another illustrative embodiment, the illumination sub-system includes a first illumination channel and a second illumination channel for illuminating an overlay target on a sample with a first illumination beam and a second illumination beam as the sample is scanned along a stage-scan direction by a translation stage, respectively. In another illustrative embodiment, the overlay target includes one or more first cells having a grating-over-grating structure with periodicity along a first direction and one or more second cells having a grating-over-grating structure with periodicity along a second direction orthogonal to the first direction. In another illustrative embodiment, the stage-scan direction corresponds to the first direction or the second direction. In another illustrative embodiment, a particular grating-over-grating structure includes first-layer grating features on a first layer of the sample and second-layer grating features on a second layer of the sample in an overlapping region. In another illustrative embodiment, the first and second illumination channels illuminate different cells of the overlay target separated along a direction orthogonal to the stage-scan direction. In another illustrative embodiment, the illumination sub-system includes one or more beam-scanners to scan the first and second illumination beams along a beam-scan direction orthogonal to the stage-scan direction while the sample is scanned along the stage-scan direction. In another illustrative embodiment, the system includes a collection sub-system. In another illustrative embodiment, the collection sub-system includes an objective lens. In another illustrative embodiment, the collection sub-system includes a first detection channel and a second detection channel associated with the first illumination channel and the second illumination channel, respectively. In another illustrative embodiment, a particular detection channel includes a first photodetector located in a pupil plane at a location of overlap between 0-order diffraction from the overlay target and +1-order diffraction from the overlay target and a second photodetector located in a pupil plane at a location of overlap between 0-order diffraction from the overlay target and −1-order diffraction from the overlay target. In another illustrative embodiment, the system includes a controller communicatively coupled to the first and second photodetectors. In another illustrative embodiment, the controller receives time-varying interference signals from the first and second photodetectors of each of the first and second detection channels as the overlay target is scanned along the measurement direction. In another illustrative embodiment, the controller determines an overlay error between the first and second layers of the sample along the first and second directions based on the time-varying interference signals.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 6A is a top view of a first 2D overlay target having cells with periodicities oriented diagonally with respect to a stage-scan direction in accordance with one or more embodiments of the present disclosure.

FIG. 7C is a top view of a first overlay target suitable for overlay measurements along the Y direction with an illumination beam being scanned along the −Y direction in accordance with one or more embodiments of the present disclosure.

FIG. 7D is a top view of a second overlay target suitable for overlay measurements along the X direction with an illumination beam being scanned along the −Y direction in accordance with one or more embodiments of the present disclosure.

DETAILED DESCRIPTION

Figure 1A:
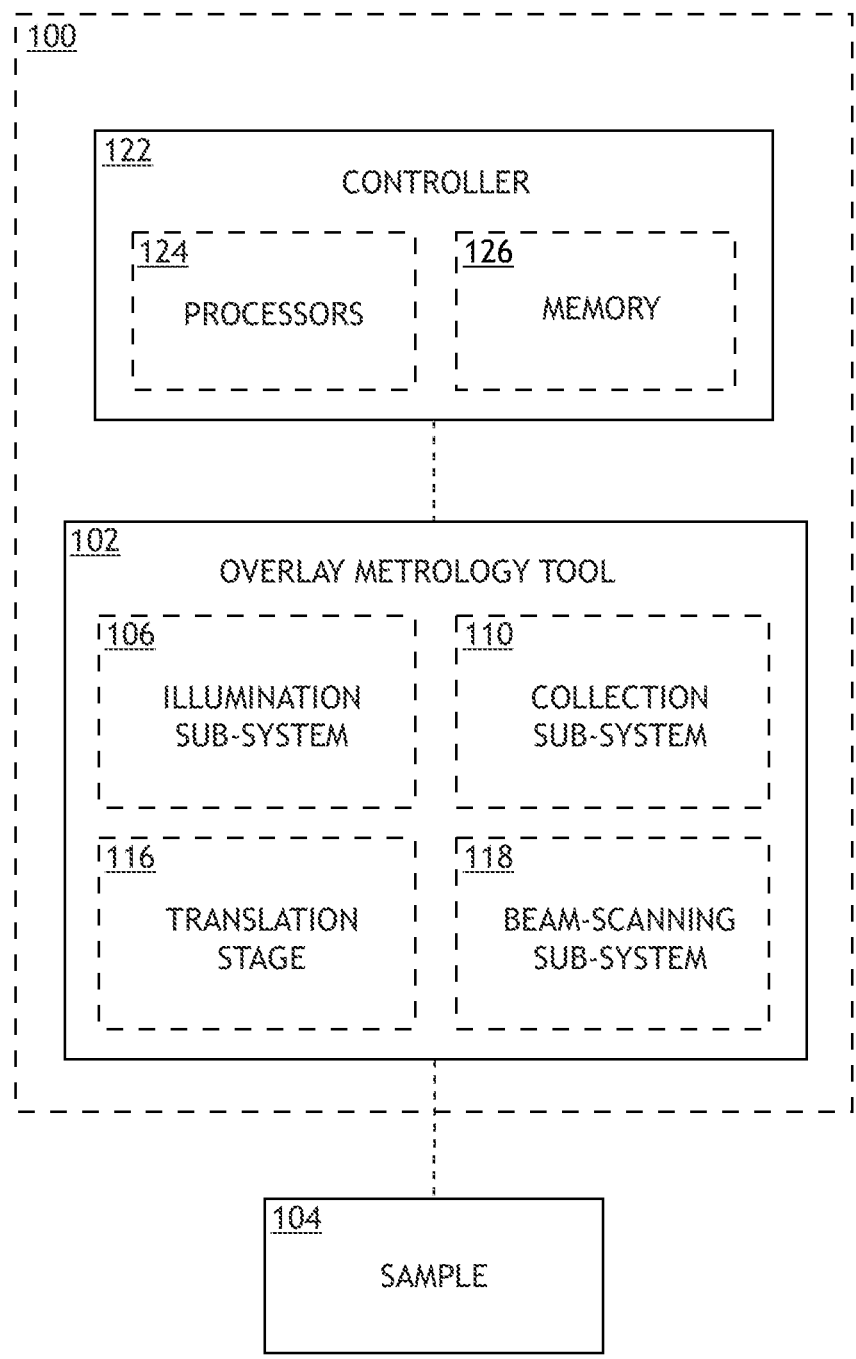
FIG. 1A is a conceptual view of a system for performing grey-scale scatterometry overlay metrology, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to grey-mode scanning scatterometry overlay. For the purposes of the present disclosure, the term scatterometry metrology is used to broadly encompass the terms scatterometry-based metrology and diffraction-based metrology in which a sample having periodic features on one or more sample layers is illuminated with an illumination beam having a limited angular extent and one or more distinct diffraction orders are collected for the measurement. Further, the term scanning metrology is used to describe metrology measurements generated when samples are in motion. In a general sense, scanning metrology may be implemented by scanning a sample along a measurement path (e.g., a swath, or the like) such that regions of interest on the sample (e.g., metrology targets, device areas, or the like) are translated through a measurement field of view of a metrology system. Further, the process may be repeated for any number of measurement paths or repeated measurements of particular measurement paths to provide any desired number of measurements of the sample.

In some embodiments, a grating-over-grating structure formed from overlapping regions of periodic structures on two or more sample layers is illuminated with an illumination beam having a limited angular extent to generate discrete diffraction orders. It is contemplated herein that intensity profiles of diffraction orders (e.g., +/−1 diffraction orders), as well as symmetry between positive and negative diffraction orders, in a collection pupil plane may be influenced by various characteristics of the grating-over-grating structure. For example, each diffraction order in the pupil plane may include diffracted light from the various gratings on the various layers of the grating-over-grating structure. Phase differences between light associated with diffraction from different sample layers may then result in intensity variations in the pupil plane such as, but not limited to, interference fringes. As a result, the intensity profile of a diffraction order in a collection pupil may be uniform or slowly-varying for grating-over-grating structures formed from relatively thin sample layers and may exhibit more pronounced variations for relatively thick sample layers.

It is additionally contemplated herein that, regardless of the particular intensity profile, the symmetry between positive and negative diffraction orders (e.g., +/−1 diffraction orders) may also be influenced by various characteristics of the grating-over-grating structures. For example, asymmetries in the grating-over-grating structure such as, but not limited to, the relative alignment of the grating features in the various layers, may manifest as asymmetries between positive and negative diffraction orders. As an illustration, a fully symmetric grating-over-grating structure may generate symmetric positive and negative diffraction orders. In contrast, sample asymmetries such as overlay errors may induce asymmetries between various aspects of the positive and negative diffraction orders such as, but not limited to, the relative intensity or phase between the positive and negative diffraction orders.

As a result, metrology measurements of asymmetries of the grating-over-grating structures such as overlay measurements may be generated based on comparisons of positive and negative diffraction orders. For example, scatterometry overlay based on pupil-plane images of diffraction orders of static samples is described generally in U.S. Patent Publication No. 2019/0004439 titled DIFFRACTION BASED OVERLAY SCATTEROMETRY and published on Jan. 3, 2019, which is incorporated herein by reference in its entirety. In this publication, phase shifts associated with an overlay measurement between +1 and −1 diffraction orders are determined through an analysis of at least one pupil-plane image in which a −1 diffraction order, a +1 diffraction order, and a 0 diffraction order are spatially separated in the pupil plane.

However, it is further contemplated herein that techniques based on pupil-plane images of static samples may have limited measurement throughput based at least in part on the time required to start and stop a translation stage when positioning an overlay target or other portion of the sample for a measurement.

Embodiments of the present disclosure are directed to scanning grey-mode scatterometry overlay metrology based on differences between time-varying interference signals associated with positive and negative diffraction in a collection pupil generated as a grating-over-grating structure is scanned through an illumination beam. In one embodiment, illumination and collection conditions are configured such that 0-order diffraction and first-order diffraction (e.g., +/−1 diffraction orders) overlap in a collection pupil plane. For example, −1 diffraction may overlap with one side of the 0-order diffraction and +1 diffraction may overlap with an opposing side of the 0-order diffraction. A photodetector is then placed in each of the overlapping regions of the pupil plane to capture time-varying interference signals associated with the +1 and −1 diffraction orders generated as the sample is scanned with respect to the illumination beam. In this way, the 0-order diffraction may serve as a common reference for the two time-varying interference signals. Further, features such as, but not limited to, the magnitude and phase of each time-varying interference signal may be extracted by any technique known in the art such as, but not limited to, one or more phase-locked-loops.

The systems and methods disclosed herein may be suitable for a wide variety of sample layouts including samples with relatively thin and relatively thick sample layers. For example, the systems and methods disclosed herein may be well suited for samples with relatively thin sample layers such as, but not limited to dynamic random-access memory (DRAM) structures. In this regard, intensity distributions of diffraction orders in the collection pupil may be relatively uniform as described previously herein, which may provide relatively low tolerances for placement of photodetectors in the overlap regions. However, the systems and methods disclosed herein may also be suitable for samples having relatively thicker layers. In this case, the placement of the photodetectors may be accurately placed in symmetric regions of the positive and negative diffraction orders. Further, the systems and/or measurements may be calibrated to increase measurement accuracy.

As a result, a metrology measurement of asymmetries of the grating-over-grating structure such as overlay measurements may be generated by comparing the two time-varying interference signals generated as the sample is scanned. Further, the metrology measurements may be generated based on a comparison of any feature or combination of features of the time-varying interference signals. For example, an overlay error or other sample asymmetry may induce an asymmetry between the relative intensity and/or phase of the positive and negative diffraction orders that may be extracted from the time-varying interference signals (e.g., based on the relative magnitudes and/or phases of the time-varying interference signals). Accordingly, it is contemplated herein that the systems and methods disclosed herein may provide data that may be analyzed using any overlay technique known in the art. In this way, overlay targets and/or algorithms associated with static measurements of static samples such as, but not limited to, those described in U.S. Patent Publication No. 2019/0004439 may be extended to a scanning regime to provide the associated throughput enhancements.

It is further contemplated herein that the systems and methods disclosed herein may provide sensitive overlay metrology at a high throughput. For example, the non-imaging configuration enables the use of fast photodetectors suitable for fast scan speeds. As a non-limiting example, photodetectors having a bandwidth of 1 GHz may enable scan speeds of approximately 10 centimeters per second on grating-over-grating targets having a pitch of 1 micrometer.

Additionally, the systems and methods disclosed herein may be relatively insensitive to target edge effects, which may enable the use of small target sizes and corresponding efficient use of space on the sample needed for overlay metrology measurements. For example, target edge effects may generally manifest as diffracted light in the pupil plane at angles associated with the target dimensions. However, the systems and methods disclosed herein limit collection of light to narrow ranges of static collection angles (e.g., associated with the sizes and locations of the photodetectors in the pupil plane) and capture time-varying data at these angles. Further, in some embodiments, an illumination beam may be extended along a direction of the grating structures (e.g., orthogonal to the direction of periodicity) to average out target noise associated with minor fluctuations in the features of the grating-over-grating structures.

The grating-over-grating features suitable for generating the diffraction patterns of interest may generally be located anywhere on the sample. In some embodiments, overlay metrology may be performed directly on device features having suitable geometries. By way of another example, overlay metrology may be performed on dedicated overlay targets, which may be located at any suitable locations such as, but not limited to, within dies or within scribe lines between dies. In this way, overlay measurements on overlay targets may be representative of the overlay of device features. Dedicated overlay targets may generally include features that are designed to provide accurate overlay measurements based on a particular overlay measurement technique. Further, overlay targets may include one or more measurement cells, where each cell includes printed elements in overlapping regions of one or more layers on the sample. An overlay measurement may then be based on any combination of measurements of the various cells of the overlay target. For example, multiple cells of an overlay target may be designed with different intended offsets (e.g., grating structures in the various layers of the sample that are intentionally misaligned with known offset values), which may improve the accuracy and/or sensitivity of the measurement.

Additional embodiments of the present disclosure are directed to measuring overlay in at least two directions. In one embodiment, an overlay target includes two sets of cells, where a first set of cells includes grating-over-grating structures oriented along a first diagonal direction different than but not orthogonal to a scan direction, and where a second set of cells includes grating-over-grating structures oriented along a second diagonal direction orthogonal to the first diagonal direction. In this way, overlay measurements along the first and second diagonal directions may be generated during a scan. Further, the scan may be implemented by translating the sample through a measurement field and/or by translating one or more illumination beams.

In another embodiment, a sample is scanned by a translation stage along a stage-scan direction and one or more illumination beams are scanned along a beam-scan direction that may be orthogonal to the stage-scan direction. In this configuration, an overlay target may include two sets of cells, where a first set of cells includes grating-over-grating structures oriented along the stage-scan direction, and where a second set of cells includes grating-over-grating structures oriented along the beam-scan direction. Further, an illumination beam may travel along a diagonal path along each cell during a measurement.

Additional embodiments of the present disclosure are directed to simultaneously illuminating an overlay target with two or more spatially-separated illumination beams. For example, an overlay target may include two or more parallel rows of cells, where each row includes one or more cells distributed along a stage scan direction. In this way, the two or more illumination beams may simultaneously illuminate cells in the two or more rows for parallelized measurements as the sample is scanned along the stage-scan direction. Further, each of the spatially-separated illumination beams may be configured with different optical parameters such as, but not limited to, polarization or wavelength. Multiplexed optical parameters such as this may provide various benefits such as, but not limited to, generating metrology data with multiple optical configurations to improve the accuracy and/or sensitivity of the measurement, or providing a mechanism for efficient separation of measurement light from the sample associated with the different illuminated cells. It is noted that the use of simultaneous illumination of multiple cells may also be beneficial in the context of metrology systems designed for static targets.

It is contemplated herein that grey-mode scatterometry overlay metrology as disclosed herein may provide numerous benefits. For example, the capability to capture measurement signals indicative of overlay as a sample is scanned may avoid stage acceleration and deceleration times required to capture an image of a static target and may thus provide relatively high measurement throughput. In this way, the number of overlay measurements in a given time period may be substantially increased. By way of another example, the systems and method disclosed herein may enable the use of a relatively large portion of the pupil, which may allow for a high light budget and corresponding signal to noise ratio benefits. By way of another example, the systems and method disclosed herein may provide a straight-forward extension of current scatterometry overlay metrology architectures and targets to scanning-mode metrology. For instance, systems designed for pupil plane imaging may be modified or supplemented to include photodetectors as disclosed herein to generate time-varying interference signals. By way of another example, as described previously, the relative insensitivity to target edge effects and spot shape control to provide noise averaging may enable the use of relatively smaller targets to promote both high-speed measurements and efficient use of space on the sample. It is noted that these considerations may also apply to metrology systems designed for static targets.

It is further contemplated herein that grey-mode scatterometry overlay metrology as disclosed herein may be implemented in combination with additional scanning scatterometry overlay metrology techniques. In one embodiment, the use of two pupil-plane photodetectors to generate time-varying interference signals may be combined with image-plane scatterometry overlay metrology techniques. For example, image-plane scatterometry overlay metrology is described generally in U.S. patent application Ser. No. 17/140,999 filed on Jan. 4, 2021, which is incorporated herein by reference in its entirety.

Referring now to FIGS. 1-9, systems and methods for grey-mode scatterometry overlay metrology are described in greater detail in accordance with one or more embodiments of the present disclosure.

Figure 1B:
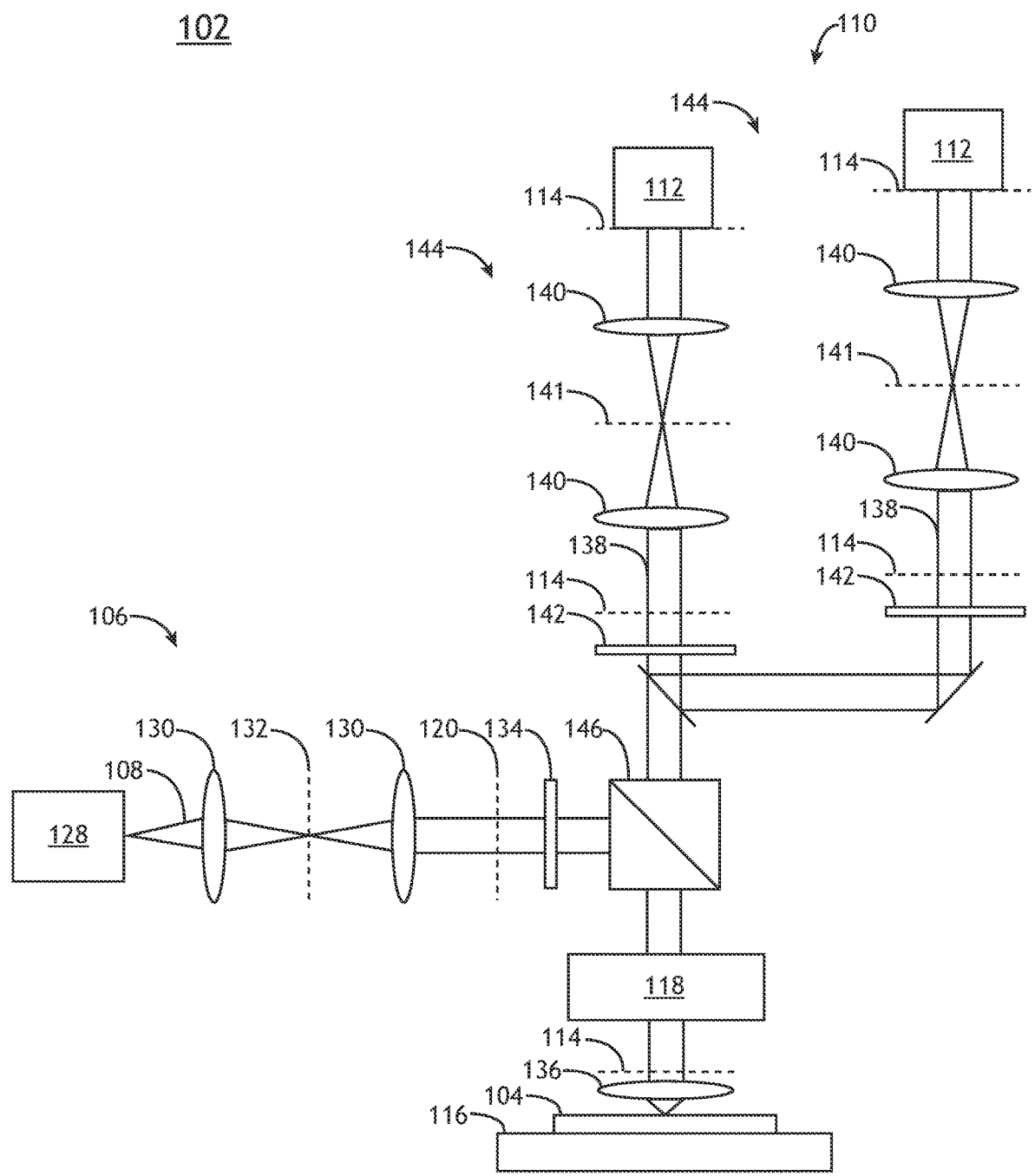
FIG. 1B is a schematic view of the overlay metrology tool in accordance with one or more embodiments of the present disclosure.

FIG. 1A is a conceptual view of a system 100 for performing grey-scale scatterometry overlay metrology, in accordance with one or more embodiments of the present disclosure. In one embodiment, the system 100 includes an overlay metrology tool 102 to perform grey-mode scatterometry overlay measurements on sample 104. For example, the overlay metrology tool 102 may perform grey-mode scatterometry overlay measurements on portions of the sample 104 having grating-over-grating structures such as, but not limited to, dedicated overlay targets. FIG. 1B is a schematic view of the overlay metrology tool 102 in accordance with one or more embodiments of the present disclosure.

In one embodiment, the overlay metrology tool 102 includes an illumination sub-system 106 to generate illumination in the form of one or more illumination beams 108 to illuminate the sample 104 and a collection sub-system 110 to collect light from the illuminated sample 104. For example, the one or more illumination beams 108 may be angularly limited on the sample 104 such that grating-over-grating structures (e.g., in one or more cells of an overlay target) may generate discrete diffraction orders. Further, the one or more illumination beams 108 may be spatially limited such that they may illuminate selected portions of the sample 104. For instance, each of the one or more illumination beams 108 may be spatially limited to illuminate a particular cell of an overlay target.

The collection sub-system 110 may then collect at least 0-order diffraction (e.g., specular reflection) and +/−1 diffraction orders from the sample 104 associated with diffraction of the illumination beam 108. Further, the collection sub-system 110 may include at least two photodetectors 112 positioned in a collection pupil plane 114 at locations of overlap between the 0-order diffraction and the +/−1 diffraction orders.

In another embodiment, the overlay metrology tool 102 includes a translation stage 116 to scan the sample 104 through a measurement field of view of the overlay metrology tool 102 during a measurement to implement scanning metrology.

In another embodiment, the overlay metrology tool 102 includes a beam-scanning sub-system 118 configured to modify or otherwise control a position of at least one illumination beam 108 on the sample 104. For example, the beam-scanning sub-system 118 may scan an illumination beam 108 in a direction orthogonal to a scan direction (e.g., a direction in which the translation stage 116 scans the sample 104) during a measurement.

Referring now to FIGS. 2A-3B, the collection of diffraction orders from grating-over-grating structures and the placement of the photodetectors 112 for grey-mode scanning scatterometry overlay metrology is described in greater detail in accordance with one or more embodiments of the present disclosure.

Figure 2A:
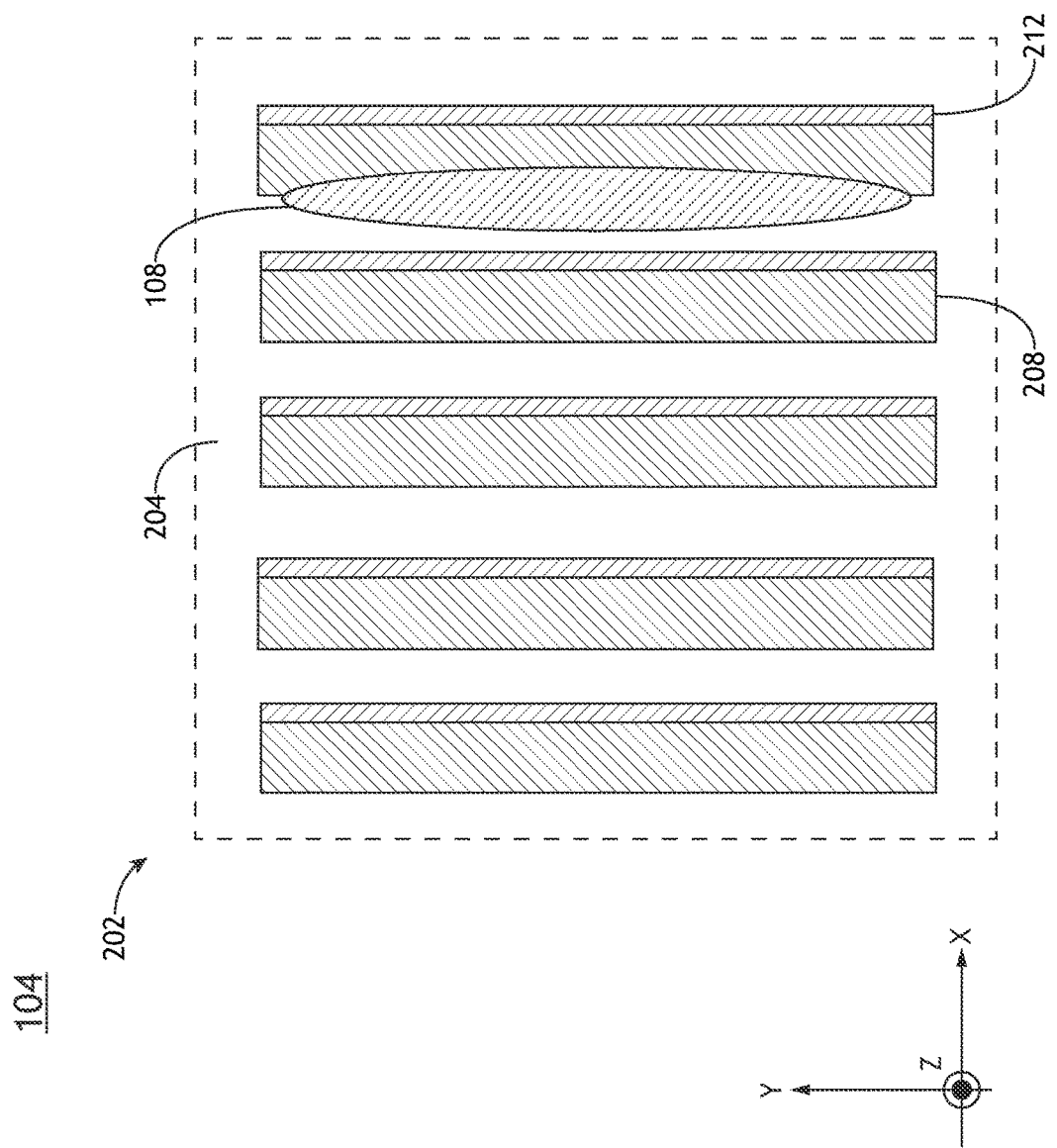
FIG. 2A is a top view of an overlay target having a single cell with a grating-over-grating structure, in accordance with one or more embodiments of the present disclosure.
Figure 2B:
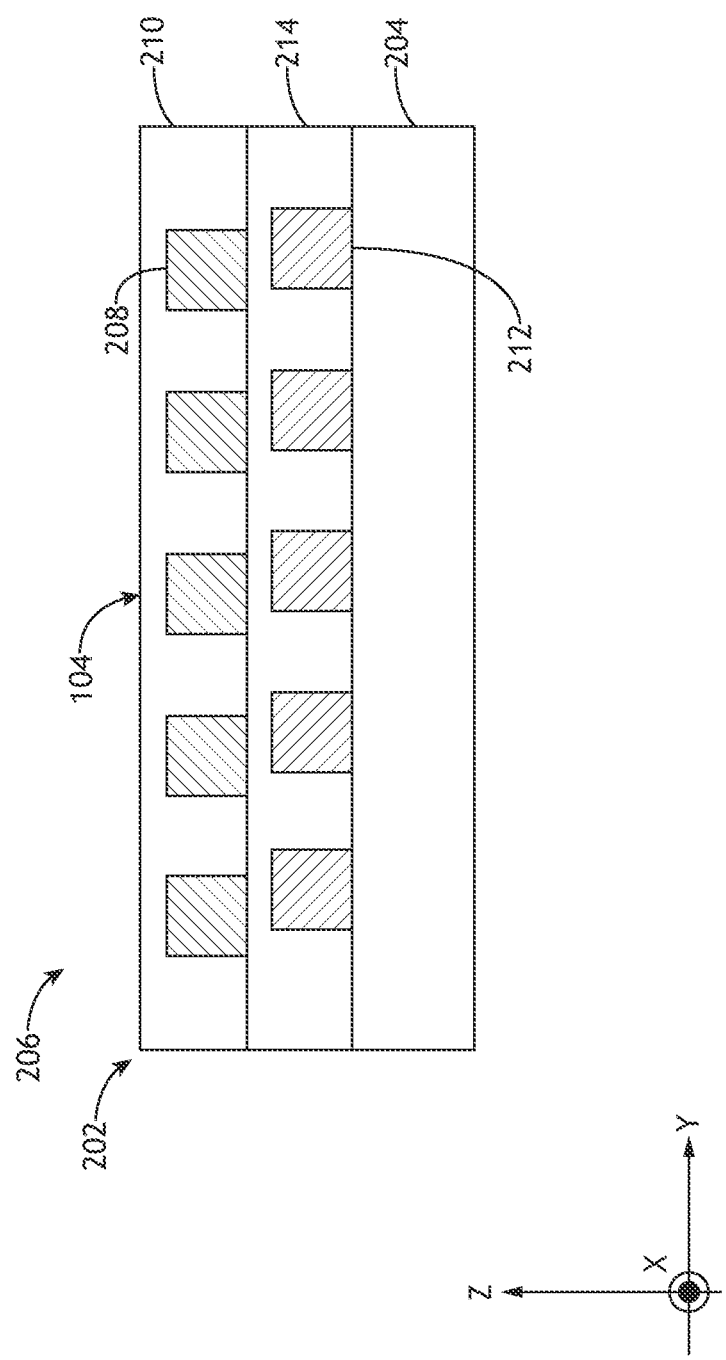
FIG. 2B is a side view of a single cell of the overlay target in FIG. 2A on a substrate, in accordance with one or more embodiments of the present disclosure.

FIG. 2A is a top view of an overlay target 202 having a single cell 204 with a grating-over-grating structure, in accordance with one or more embodiments of the present disclosure. FIG. 2B is a side view of a single cell 204 of the overlay target 202 in FIG. 2A on a substrate 206, in accordance with one or more embodiments of the present disclosure. In one embodiment, the cell 204 includes first-layer printed elements 208 located on a first layer 210 of the sample 104 and second-layer printed elements 212 located on a second layer 214 of the sample 104 oriented such that the regions including the first-layer printed elements 208 and the second-layer printed elements 212 overlap to form a grating-over-grating structure. Further, as illustrated in FIGS. 2A and 2B, the first-layer printed elements 208 may be, but are not required to be, designed to include an intended offset from the second-layer printed elements 212 along the measurement direction (e.g., the Y direction in FIG. 2B) by a selected amount, which may facilitate the measurement of overlay error associated with a deviation from the intended offset along the measurement direction. As will be described in greater detail below, it is to be understood that an overlay target 202 may generally be formed from any number of cells 204 and that any particular cell 204 may include a grating-over-grating feature with a periodicity along any direction.

It is to be understood, however, that the overlay target 202 in FIGS. 2A and 2B and the associated description are provided solely for illustrative purposes and should not be interpreted as limiting. Rather, the overlay target 202 may include any suitable grating-over-grating overlay target design. For example, the overlay target 202 may include any number of cells 204 suitable for measurements along two directions. Further, the cells 204 may be distributed in any pattern or arrangement. For example, metrology target designs suitable for scanning metrology are generally described in U.S. patent application Ser. No. 16/598,146 filed on Oct. 10, 2019, which is incorporated herein by reference in its entirety. In one embodiment, the overlay target 202 includes one or more cell groupings distributed along a scanning direction (e.g., a direction of motion of the sample 104), where cells 204 within each particular cell grouping are oriented to have grating-over-grating structures periodic along a common direction. For instance, a first cell grouping may include one or more cells 204 having periodicities along the X direction and a second cell grouping may include one or more cells 204 having periodicities along the Y direction. In this way, all cells 204 within a particular cell grouping may be imaged at the same time while the sample 104 is scanned through a measurement field of view of the collection sub-system 110. By way of another example, diagonal targets suitable for metrology measurements in orthogonal directions in a single scan are described generally in U.S. patent application Ser. No. 16/964,734 filed on Jul. 24, 2020, which is incorporated herein by reference in its entirety.

FIG. 2A further illustrates an illumination spot associated with an illumination beam 108 on the cell 204. In one embodiment, the illumination sub-system 106 underfills the cell 204 such that the size of the illumination beam 108 is smaller than the cell 204. As a result, a distribution of light in the collection pupil plane 114 may be substantially limited to light diffracted from the grating-over-grating features in the cell 204 and target edge effects may be minimized or substantially eliminated. Further, the illumination beam 108 may be sized based on the size and/or pitch of a grating-over-grating structure in a cell 204. In a general sense, the illumination beam 108 may generally be sized to be less than a height of the cell 204 and to have a width at least one pitch smaller than the width of the cell 204 to provide clear interference fringes.

As an example, FIG. 2A illustrates an illumination beam 108 having a width along the measurement direction (here the X direction) set to approximately half of the pitch of the grating-over-grating structures. In one non-limiting instance, the dimensions of the illumination beam 108 suitable for a 10 micrometer square cell 204 may be 1.5 micrometers in the Y direction and 0.5 micrometers in the X direction, which may be achieved with an oval pupil in the illumination pupil plane 120 of 0.9×0.3 NA. However, it is to be understood that the depiction of the illumination beam 108 in FIG. 2A is provided solely for illustrative purposes and should not be interpreted as limiting. The illumination beam 108 may generally have any size suitable for generating overlapping 0 and first-order diffraction as described herein.

In another embodiment, the illumination beam 108 may be elongated in a direction perpendicular to a measurement direction to further mitigate target-induced noise caused by imperfections in the cell 204 such as, but not limited to, roughness of the first-layer printed elements 208 or the second-layer printed elements 212. For example, FIG. 2A illustrates the illumination beam 108 elongated along the Y direction.

Figure 3B:
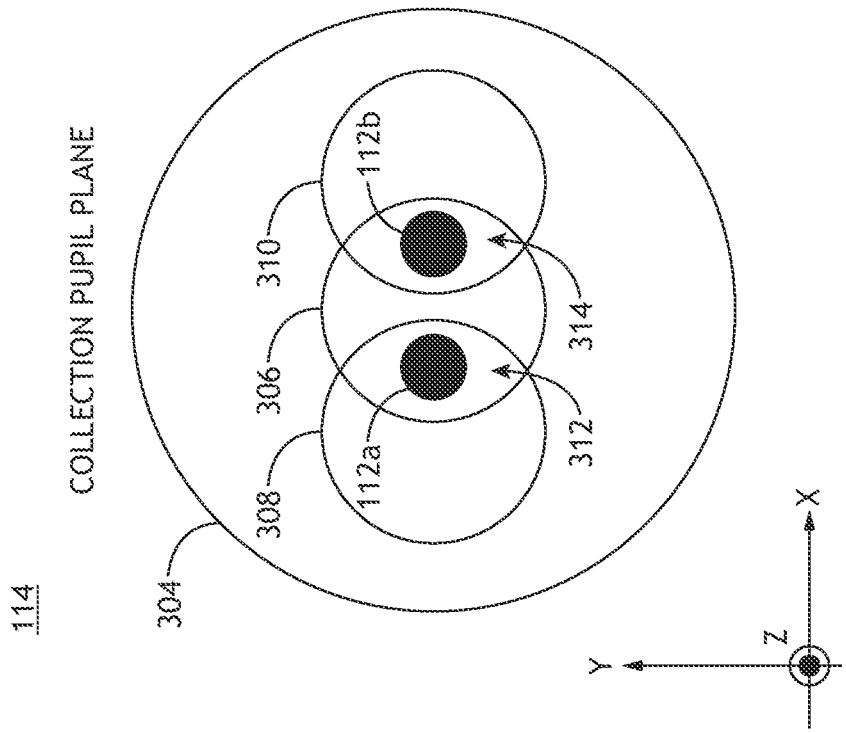
FIG. 3B is a top view of a collection pupil in the collection pupil plane of the overlay metrology tool in accordance with one or more embodiments of the present disclosure.
Figure 3A:
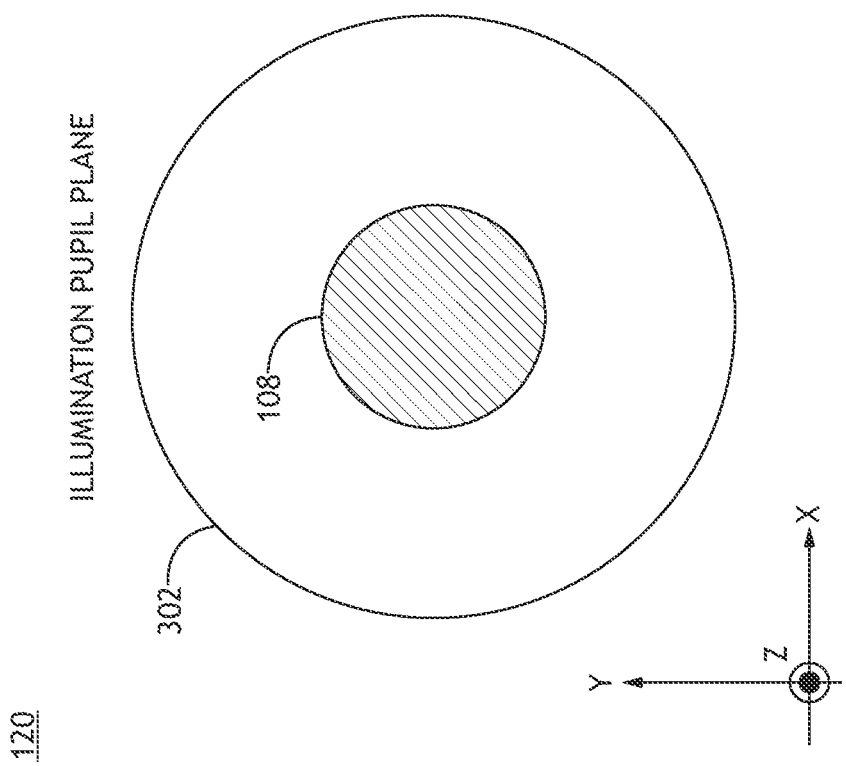
FIG. 3A is a top view of an illumination pupil in an illumination pupil plane of the overlay metrology tool in accordance with one or more embodiments of the present disclosure.

FIG. 3A is a top view of an illumination pupil 302 in an illumination pupil plane 120 of the overlay metrology tool 102 in accordance with one or more embodiments of the present disclosure. For example, the illumination pupil plane 120 may correspond to a pupil plane in the illumination sub-system 106 as illustrated in FIG. 1B. FIG. 3B is a top view of a collection pupil 304 in the collection pupil plane 114 of the overlay metrology tool 102 in accordance with one or more embodiments of the present disclosure. For example, the collection pupil plane 114 may correspond to a pupil plane in the collection sub-system 110 as illustrated in FIG. 1B.

In one embodiment, the illumination sub-system 106 illuminates the overlay target 202 with one or more illumination beams 108 at normal incidence (or near-normal incidence) as illustrated in FIG. 3A. Further, the one or more illumination beams 108 may illuminate the overlay target 202 with a limited range of incidence angles as illustrated by the limited size in the collection pupil plane 114. In this regard, the overlay target 202 may diffract the one or more illumination beams 108 into discrete diffraction orders.

FIG. 3B illustrates a distribution of 0-order diffraction 306, −1 order diffraction 308, and +1 order diffraction 310 distributed along the direction of periodicity of the grating-over-grating structure (e.g., the X direction here) in the collection pupil plane 114. In particular, the −1 order diffraction 308 and the +1 order diffraction 310 are distributed on opposite sides of the 0-order diffraction 306.

In another embodiment, the illumination sub-system 106, the collection sub-system 110, and the overlay target 202 are configured to provide that the first-order diffraction (e.g., the −1 order diffraction 308 and the +1 order diffraction 310) partially overlaps the 0-order diffraction 306. For example, as illustrated in FIG. 3B, the −1 order diffraction 308 overlaps with the 0-order diffraction 306 to form a first overlap region 312, and the +1 order diffraction 310 overlaps with the 0-order diffraction 306 to form a second overlap region 314.

It is recognized herein that the distribution of diffracted orders of an illumination beam 108 by a periodic structure such as a grating-over-grating structure may be influenced by a variety of parameters such as, but not limited to, a wavelength of the illumination beam 108, an incidence angle of the illumination beam 108 in both altitude and azimuth directions, a period of the periodic structures, or a numerical aperture (NA) of a collection lens. Accordingly, in embodiments of the present disclosure, the illumination sub-system 106, the collection sub-system 110, and the overlay target 202 may be configured to provide an overlapping distribution of 0-order diffraction 306 and first-order diffraction in the collection pupil plane 114 of the collection sub-system 110. For example, the illumination sub-system 106 and/or the collection sub-system 110 may be configured to generate measurements on grating-over-grating structures having a selected range of periodicities that provide the overlapping distribution. Further, various components of the illumination sub-system 106 and/or the collection sub-system 110 (e.g., stops, pupils, or the like) may be adjustable to provide the overlapping distribution for a given grating-over-grating structure with a given periodicity.

Further, the sizes and shapes of diffraction orders in the collection pupil plane 114 may generally be related to the size and shape of the illumination beam 108 on the sample 104. For example, although not shown, in the case that the illumination beam 108 is elongated (e.g., as illustrated in FIG. 2A), the 0-order diffraction 306, −1 order diffraction 308, and +1 order diffraction 310 may similarly be elongated (e.g., in orthogonal directions).

In another embodiment, the overlay metrology tool 102 includes photodetectors 112 located in the overlap regions of the collection pupil plane 114. For example, as illustrated in FIG. 3B, a first photodetector 112a is located in the first overlap region 312 and a second photodetector 112b is located in the second overlap region 314. Each of the photodetectors 112 may then capture a time-varying interference signal as the sample 104 is scanned. In particular, as an overlay target 202 is scanned along a direction of periodicity of a grating-over-grating structure (e.g., the X direction in FIGS. 2A and 2B) the phase of the +/−1 diffraction orders 308,310 relative to the 0-order diffraction 306 shifts in opposite directions. Accordingly, scanning the overlay target 202 by a length equal to a pitch of the grating-over-grating structure results in a phase shift of $2\pi$ in each of the +/−1 diffraction orders 308,310 (in opposite directions) and the intensity captured by each of the photodetectors 112 oscillates through an interference fringe.

The photodetectors 112 may generally include any type of optical detector known in the art suitable for capturing interference signals generated as the sample 104 is translated by the translation stage 116 and/or as one or more illumination beams 108 are scanned by the beam-scanning sub-system 118. For example, the photodetectors 112 may include, but are not limited to, fast photodiodes.

In a general sense, the bandwidth or response time of the photodetectors 112 should be sufficient to resolve the temporal frequency of the interference fringes, which is related to the pitch of the grating-over-grating structures and the scanning speed along a measurement direction (the direction of periodicity of the grating-over-grating structure). For example, in the case of a scan speed along a measurement direction of 10 centimeters per second and a target pitch of 1 micrometer, the interference signals will oscillate at a rate on the order of 100 kHz. In one embodiment, the photodetectors 112 include photodetectors having a bandwidth of at least 1 GHz. However, it is to be understood that this value is not a requirement. Rather, the bandwidth of the photodetectors 112, the translation speed along the measurement direction, and the pitch of the grating-over-grating structures may be selected together to provide a desired sampling rate of the interference signal.

Referring again to FIG. 1A, additional components of the overlay metrology tool 102 are described in greater detail in accordance with one or more embodiments of the present disclosure.

In another embodiment, the system 100 includes a controller 122 communicatively coupled to the overlay metrology tool 102. The controller 122 may include one or more processors 124 and a memory device 126, or memory. For example, the one or more processors 124 may be configured to execute a set of program instructions maintained in the memory device 126.

The one or more processors 124 of the controller 122 may generally include any processor or processing element known in the art. For the purposes of the present disclosure, the term "processor" or "processing element" may be broadly defined to encompass any device having one or more processing or logic elements (e.g., one or more microprocessor devices, one or more application specific integrated circuit (ASIC) devices, one or more field programmable gate arrays (FPGAs), or one or more digital signal processors (DSPs)). In this sense, the one or more processors 124 may include any device configured to execute algorithms and/or instructions (e.g., program instructions stored in memory). In one embodiment, the one or more processors 124 may be embodied as a desktop computer, mainframe computer system, workstation, image computer, parallel processor, networked computer, or any other computer system configured to execute a program configured to operate or operate in conjunction with the system 100, as described throughout the present disclosure. Moreover, different subsystems of the system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 122 may include one or more controllers housed in a common housing or within multiple housings. In this way, any controller or combination of controllers may be separately packaged as a module suitable for integration into metrology system 100. Further, the controller 122 may analyze or otherwise process data received from the photodetectors 112 and feed the data to additional components within the system 100 or external to the system 100.

Further, the memory device 126 may include any storage medium known in the art suitable for storing program instructions executable by the associated one or more processors 124. For example, the memory device 126 may include a non-transitory memory medium. As an additional example, the memory device 126 may include, but is not limited to, a read-only memory, a random-access memory, a magnetic or optical memory device (e.g., disk), a magnetic tape, a solid-state drive and the like. It is further noted that memory device 126 may be housed in a common controller housing with the one or more processors 124.

In this regard, the controller 122 may execute any of various processing steps associated with overlay metrology. For example, the controller 122 may be configured to generate control signals to direct or otherwise control the overlay metrology tool 102, or any components thereof. For instance, the controller 122 may be configured to direct the translation stage 116 to translate the sample 104 along one or more measurement paths, or swaths, to scan one or more overlay targets through a measurement field of view of the overlay metrology tool 102 and/or direct the beam-scanning sub-system 118 to position or scan one or more illumination beams 108 on the sample 104. By way of another example, the controller 122 may be configured to receive signals corresponding to the time-varying interference signals from the photodetectors 112. By way of another example, the controller 122 may generate correctables for one or more additional fabrication tools as feedback and/or feed-forward control of the one or more additional fabrication tools based on overlay measurements from the overlay metrology tool 102.

In another embodiment, the controller 122 capture the interference signals detected by the photodetectors 112. The controller 122 may generally capture data such as, but not limited to, the magnitudes or the phases of the interference signals using any technique known in the art such as, but not limited to, one or more phase-locked loops. Further, the controller 122 may capture the interference signals, or any data associated with the interference signals, using any combination of hardware (e.g., circuitry) or software techniques.

In another embodiment, the controller 122 determines an overlay measurement between layers of the overlay target 202 (e.g., the first layer 210 and the second layer 214) along the measurement direction based on the comparison of the interference signals. For example, the controller 122 may compare the magnitudes and/or phases of the interference signals to generate an overlay measurement. For instance, U.S. Patent Publication No. 2019/0004439 referenced above and incorporated herein by reference in its entirety generally describes the electric field of diffracted orders in a collection pupil and further provides specific relationships between overlay and measured intensity in the pupil plane. It is contemplated herein that the systems and methods disclosed herein may extend the teachings of U.S. Patent Publication No. 2019/0004439 to time-varying interference signals captured by photodetectors placed in overlap regions between 0 and +/−1 diffraction orders. In particular, it is contemplated herein that overlay on a sample may be proportional to a relative phase shift between the two time-varying interference signals. In another instance, the relative intensities of the diffraction orders in the pupil plane may be extracted from the time-varying interference signals. In this way, any overlay algorithm based on relative intensity differences of diffraction orders known in the art may be applied to generate an overlay measurement.

Further, the controller 122 may calibrate or otherwise modify the overlay measurement based on known, assumed, or measured features of the sample that may also impact the time-varying interference signals such as, but not limited to, sidewall angles or other sample asymmetries.

Referring again to FIG. 1B, various components of the overlay metrology tool 102 are described in greater detail in accordance with one or more embodiments of the present disclosure.

In one embodiment, the illumination sub-system 106 includes an illumination source 128 configured to generate at least one illumination beam 108. The illumination from the illumination source 128 may include one or more selected wavelengths of light including, but not limited to, ultraviolet (UV) radiation, visible radiation, or infrared (IR) radiation.

The illumination source 128 may include any type of illumination source suitable for providing at least one illumination beam 108. In one embodiment, the illumination source 128 is a laser source. For example, the illumination source 128 may include, but is not limited to, one or more narrowband laser sources, a broadband laser source, a supercontinuum laser source, a white light laser source, or the like. In this regard, the illumination source 128 may provide an illumination beam 108 having high coherence (e.g., high spatial coherence and/or temporal coherence). In another embodiment, the illumination source 128 includes a laser-sustained plasma (LSP) source. For example, the illumination source 128 may include, but is not limited to, a LSP lamp, a LSP bulb, or a LSP chamber suitable for containing one or more elements that, when excited by a laser source into a plasma state, may emit broadband illumination.

In another embodiment, the illumination sub-system 106 includes one or more optical components suitable for modifying and/or conditioning the illumination beam 108 as well as directing the illumination beam 108 to the sample 104. For example, the illumination sub-system 106 may include one or more illumination lenses 130 (e.g., to collimate the illumination beam 108, to relay an illumination pupil plane 120 and/or an illumination field plane 132, or the like). In another embodiment, the illumination sub-system 106 includes one or more illumination control optics 134 to shape or otherwise control the illumination beam 108. For example, the illumination control optics 134 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In another embodiment, the overlay metrology tool 102 includes an objective lens 136 to focus the illumination beam 108 onto the sample 104 (e.g., an overlay target with overlay target elements located on two or more layers of the sample 104).

In some embodiments, the illumination sub-system 106 illuminates the sample 104 with two or more illumination beams 108. Further, the two or more illumination beams 108 may be, but are not required to be, incident on different portions of the sample 104 (e.g., different cells of an overlay target) within a measurement field of view (e.g., a field of view of the objective lens 136). It is contemplated herein that the two or more illumination beams 108 may be generated using a variety of techniques. In one embodiment, the illumination sub-system 106 includes two or more apertures at an illumination field plane 132. In another embodiment, the illumination sub-system 106 includes one or more beamsplitters to split illumination from the illumination source 128 into the two or more illumination beams 108. In another embodiment, at least one illumination source 128 generates two or more illumination beams 108 directly. In a general sense, each illumination beam 108 may be considered to be a part of a different illumination channel regardless of the technique in which the various illumination beams 108 are generated.

In another embodiment, the collection sub-system 110 includes at least two photodetectors 112 located at a collection pupil plane 114 configured to capture light from the sample 104 (e.g., collected light 138), where the collected light 138 includes at least the 0-order diffraction 306, the −1 order diffraction 308, and the +1 order diffraction 310 as illustrated in FIG. 3B. The collection sub-system 110 may include one or more optical elements suitable for modifying and/or conditioning the collected light 138 from the sample 104. In one embodiment, the collection sub-system 110 includes one or more collection lenses 140 (e.g., to collimate the illumination beam 108, to relay pupil planes 114 and/or field planes 141, or the like), which may include, but are not required to include, the objective lens 136. In another embodiment, the collection sub-system 110 includes one or more collection control optics 142 to shape or otherwise control the collected light 138. For example, the collection control optics 142 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In another embodiment, the collection sub-system 110 includes two or more collection channels 144, each with a separate pair of photodetectors 112. For example, as illustrated in FIG. 1B, the overlay metrology tool 102 may include one or more beamsplitters 146 arranged to split the collected light 138 into the collection channels 144. Further, the beamsplitters 146 may be polarizing beamsplitters, non-polarizing beamsplitters, or a combination thereof.

In one embodiment, multiple collection channels 144 are configured to collect light from multiple illumination beams 108 on the sample 104. For example, in the case that an overlay target 202 has two or more cells 204 distributed in a direction different than a scan direction, the overlay metrology tool 102 may simultaneously illuminate the different cells 204 with different illumination beams 108 and simultaneously capture interference signals associated with each illumination beam 108. Additionally, in some embodiments, multiple illumination beams 108 directed to the sample 104 may have different polarizations. In this way, the diffraction orders associated with each of the illumination beams 108 may be separated. For example, polarizing beamsplitters 146 may efficiently separate the diffraction orders associated with the different illumination beams 108. By way of another example, polarizers may be used in one or more collection channels 144 to isolate desired diffraction orders for measurement.

In some embodiments, the overlay metrology tool 102 includes a beam-scanning sub-system 118 to position, scan, or modulate positions of one or more illumination beams 108 on the sample 104 during measurement.

The beam-scanning sub-system 118 may include any type or combination of elements suitable for scanning positions of one or more illumination beams 108. In one embodiment, the beam-scanning sub-system 118 includes one or more deflectors suitable for modifying a direction of an illumination beam 108. For example, a deflector may include, but is not limited to, a rotatable mirror (e.g., a mirror with adjustable tip and/or tilt). Further, the rotatable mirror may be actuated using any technique known in the art. For example, the deflector may include, but is not limited to, a galvanometer, a piezo-electric mirror, or a micro-electro-mechanical system (MEMS) device. By way of another example, the beam-scanning sub-system 118 may include an electro-optic modulator, an acousto-optic modulator, or the like.

The deflectors may further be positioned at any suitable location in the overlay metrology tool 102. In one embodiment, one or more deflectors are placed at one or more pupil planes common to both the illumination sub-system 106 and the collection sub-system 110. In this regard, the beam-scanning sub-system 118 may be a pupil-plane beam scanner and the associated deflectors may modify the positions of one or more illumination beams 108 on the sample 104 without impacting positions of diffraction orders in the collection pupil plane 114. Further, a distribution of one or more illumination beams 108 in an illumination field plane 132 may further be stable as the beam-scanning sub-system 118 modifies positions of the one or more illumination beams 108 on the sample 104. Pupil-plane beam scanning is described generally in U.S. patent application Ser. No. 17/142,783 filed on Jan. 6, 2021, which is incorporated by reference in its entirety.

Referring now to FIGS. 4-8B, various exemplary configurations of the overlay target 202 and corresponding configurations of the overlay metrology tool 102 are described in greater detail in accordance with one or more embodiments of the present disclosure. In FIGS. 4-8B, only the first-layer printed elements 208 are shown for clarity. However, it is to be understood that the overlay targets 202 may include grating-over-grating structures.

Figure 4:
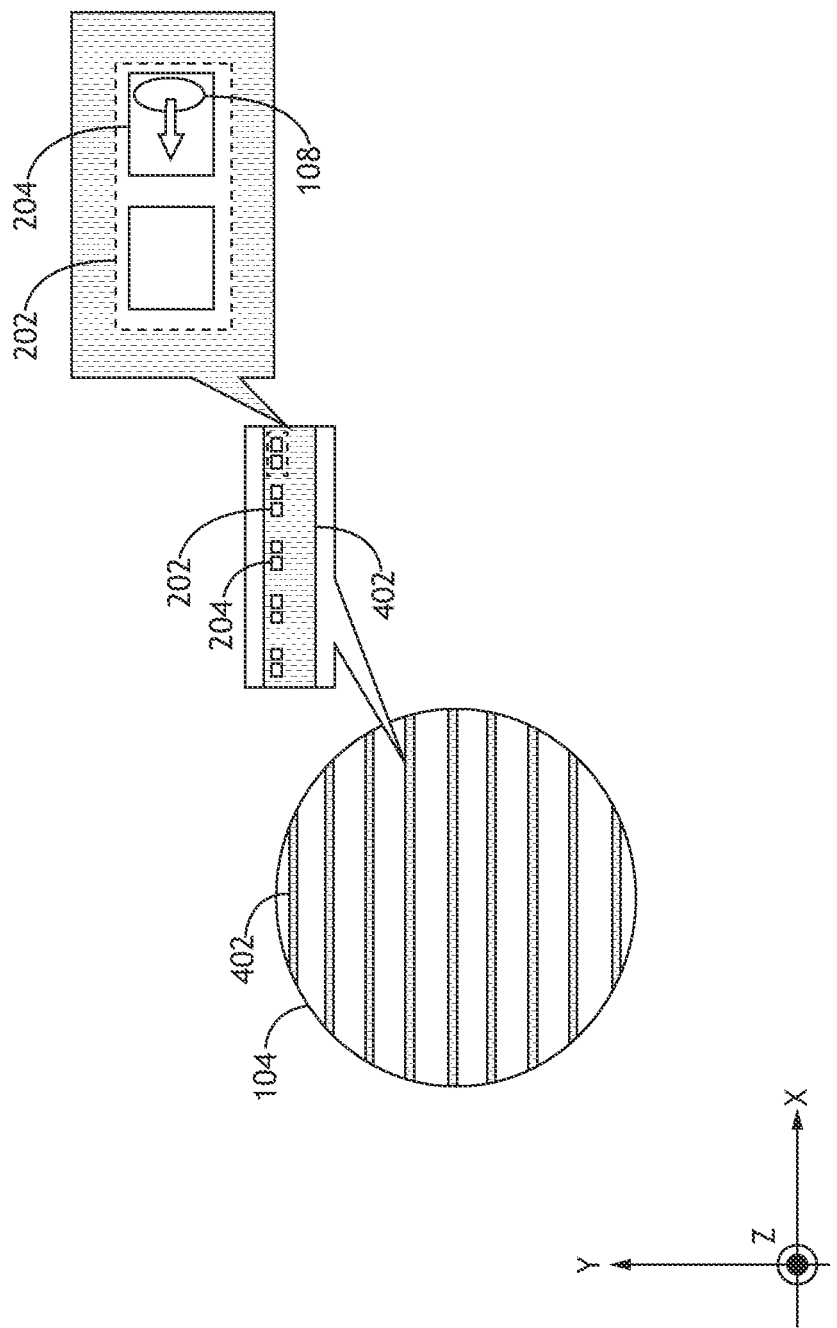
FIG. 4 is a conceptual view of a sample illustrating a placement of overlay targets and corresponding measurement paths to measure the overlay targets in accordance with one or more embodiments of the present disclosure.

FIG. 4 is a conceptual view of a sample 104 illustrating a placement of overlay targets 202 and corresponding measurement paths 402 (e.g., swaths) to measure the overlay targets 202 in accordance with one or more embodiments of the present disclosure.

In one embodiment, multiple overlay targets 202 are distributed across the sample 104 at locations suitable for overlay measurements including, but not limited to, scribe lines. Further, various measurement paths 402 defining scan paths are defined to provide measurements of selected overlay targets 202 across the sample 104. For example, FIG. 4 illustrates multiple measurement paths 402 along the Y direction to measure various overlay targets 202.

An overlay target 202 may include any number of cells 204, where each cell 204 may include a grating-over-grating structure having a periodicity along any selected direction. In this regard, various designs of overlay targets 202 may be utilized within the spirit and scope of the present disclosure. For example, the overlay targets 202 in FIG. 4 are illustrated as having two cells 204 distributed along the X direction.

In some embodiments, an overlay target 202 includes a first set of one or more cells 204 where each cell 204 has a grating-over-grating structure with a periodicity along a first direction and a second set of one or more cells 204 where each cell 204 has a grating-over-grating structure with a periodicity along a second direction. Further, the second direction may be, but is not required to be, orthogonal to the first direction. In this way, the first set of one or more cells 204 may be suitable for overlay measurements along the first direction and the second set of one or more cells 204 may be suitable for overlay measurements along the second direction such that a full 2D overlay measurement may be obtained.

In a general sense, providing multiple cells 204 in an overlay target 202 suitable for measurement along a particular direction may facilitate a measurement over a larger area than provided by a single cell 204, which may improve the accuracy and/or sensitivity of the measurement. Further, the various cells 204 suitable for measurement along a particular direction may be distributed along the measurement direction and/or along a direction orthogonal to the measurement direction.

Figure 5:
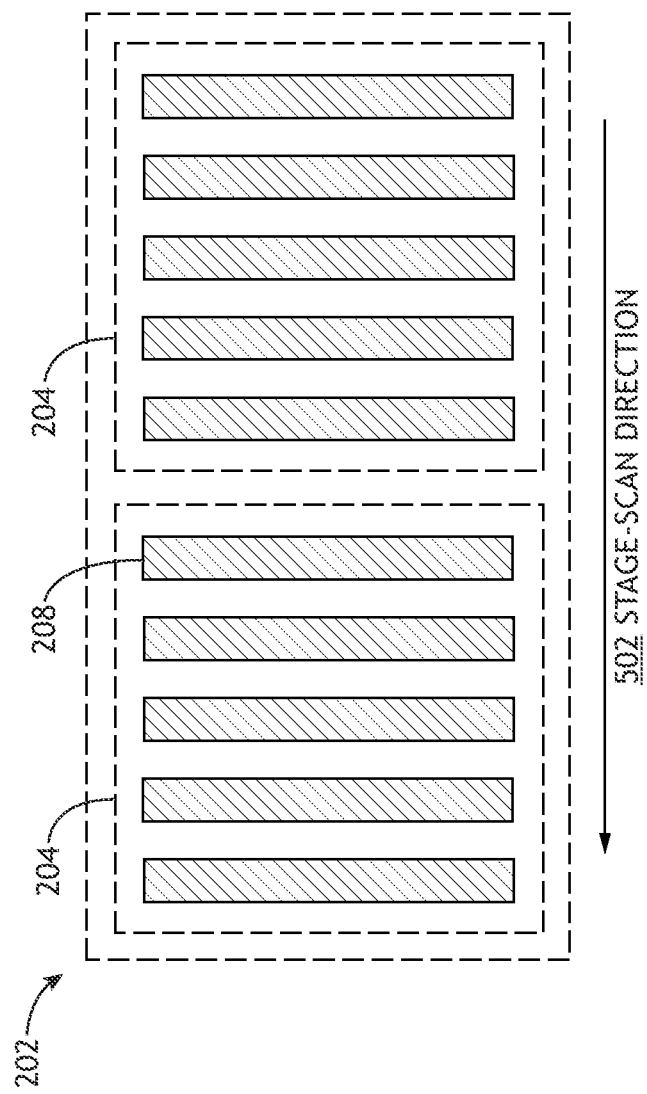
FIG. 5 is a top view of a 1D overlay target including two cells aligned along a stage-scan direction, where each of the cells has a grating-over-grating feature having a periodicity along the stage-scan direction in accordance with one or more embodiments of the present disclosure.
Figure 6B:
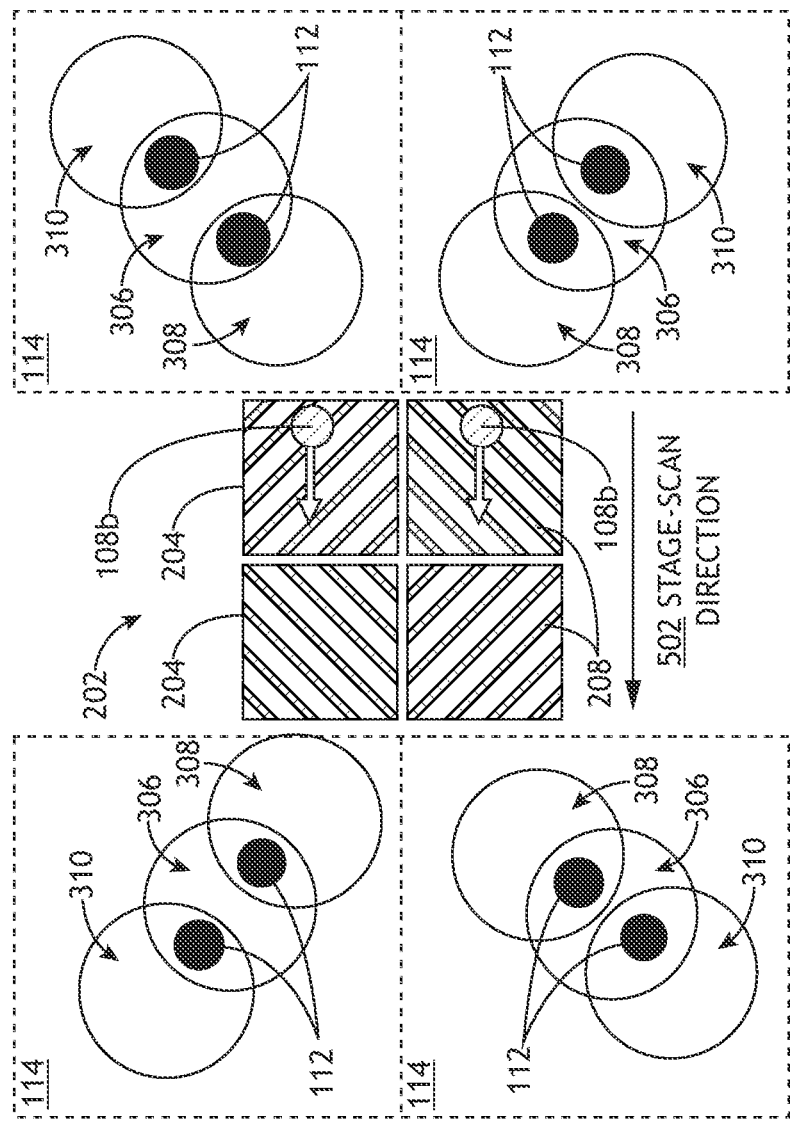
FIG. 6B is a top view of a second 2D overlay target having cells with periodicities oriented diagonally with respect to a stage-scan direction in accordance with one or more embodiments of the present disclosure.

Referring now to FIGS. 5-6B, designs of overlay targets 202 suitable for overlay measurements along one or two directions using a stationary illumination beam 108 (e.g., without the use of a beam-scanning sub-system 118) are described in greater detail in accordance with one or more embodiments of the present disclosure.

FIG. 5 is a top view of a 1D overlay target 202 including two cells 204 aligned along a stage-scan direction 502, where each of the cells 204 has a grating-over-grating feature having a periodicity along the stage-scan direction 502 in accordance with one or more embodiments of the present disclosure. In this way, the stage-scan direction 502 and the measurement direction associated with the periodicity of the grating-over-grating structures in the cells 204 are fully aligned. In this configuration, a first set of measurement paths 402 may be generated to measure overlay targets 202 configured for measurement in one direction (e.g., the X direction) and a second set of measurement paths 402 may be generated to measure overlay targets 202 configured for measurement in a second direction (e.g., the Y direction) to provide 2D overlay measurements of the sample 104.

FIGS. 6A and 6B illustrate 2D overlay targets 202 having grating-over-grating structures that are periodic along diagonal directions with respect to the scan direction.

FIG. 6A is a top view of a first 2D overlay target 202 having cells 204 with periodicities oriented diagonally with respect to a stage-scan direction 502 in accordance with one or more embodiments of the present disclosure. FIG. 6B is a top view of a second 2D overlay target 202 having cells 204 with periodicities oriented diagonally with respect to a stage-scan direction 502 in accordance with one or more embodiments of the present disclosure. Offset images in FIGS. 6A and 6B illustrate a distribution of diffracted orders in the collection pupil plane 114, as well as the corresponding locations of the pairs of photodetectors 112, for the corresponding cells 204. For example, the distribution of the diffraction orders illustrated in the offset images in FIGS. 6A and 6B may be substantially similar to FIG. 3B, where the diffraction orders (e.g., 0-order diffraction 306, −1 order diffraction 308, and +1 order diffraction 310) are rotated based on the direction of periodicity of each cell 204.

In FIGS. 6A and 6B, the overlay target 202 includes a first set of cells 204 distributed along the stage-scan direction 502 that may be illuminated with a first illumination beam 108a and a second set of cells 204 distributed along the stage-scan direction 502 that may be illuminated with a second illumination beam 108b. Further, the first and second sets of cells are offset along a direction orthogonal to the stage-scan direction 502. In this way, both illumination beams 108a,b may simultaneously probe separate cells 204 as the sample 104 is scanned.

Further, FIGS. 6A and 6B illustrate various non-limiting configurations of cells 204 having periodicities in two orthogonal directions suitable for 2D overlay measurements. In FIG. 6A, cells 204 oriented to have periodicity along a common diagonal direction are grouped into rows. In this regard, the orientation of the diffraction orders and thus the orientations of the photodetectors 112 required to obtain measurements for the cells 204 are constant for each row as illustrated in the offset images in FIG. 6A. In FIG. 6B, each illumination beam 108 scans across cells 204 having periodicities in both diagonal directions. In this way, systematic errors associated with a particular illumination beam 108 may be mitigated. However, as illustrated in the offset images in FIG. 6B, the orientation of the photodetectors 112 may be different for different cells 204 along the stage-scan direction 502. In one embodiment, the collection sub-system 110 is configured with a single collection channel 144 having suitably placed photodetectors 112 in overlap areas associated with both diagonal directions. The controller 122 may then selectively analyze the corresponding pairs of photodetectors 112 associated with each cell 204 when generating an overlay measurement. In another embodiment, the collection sub-system 110 is configured with two collection channels 144, each with a pair of photodetectors 112 in overlap areas associated with a single diagonal direction. The controller 122 may then selectively analyze the corresponding collection channel 144 associated with each cell 204 when generating an overlay measurement.

It is recognized herein that in some applications it may be desirable or customary to provide overlay measurements along the stage-scan direction 502. Accordingly, overlay measurements along the first and second diagonal directions may be transformed using linear transformations to provide overlay measurements along any desired directions on the sample 104.

Referring now to FIGS. 7A-8B, designs of overlay targets 202 suitable for overlay measurements in which a beam-scanning sub-system 118 scans one or more illumination beams 108 during a measurement are described in greater detail in accordance with one or more embodiments of the present disclosure. In FIGS. 7A-8B, the beam-scanning sub-system 118 scans one or more illumination beams 108 along a beam-scanning direction 702 different than the stage-scan direction 502 (e.g., orthogonal to the stage-scan direction 502) as the sample 104 is scanned along the stage-scan direction 502. In this way, each illumination beam 108 may be scanned across the overlay target 202 (or a cell 204 thereof) along a diagonal path.

Figure 7B:
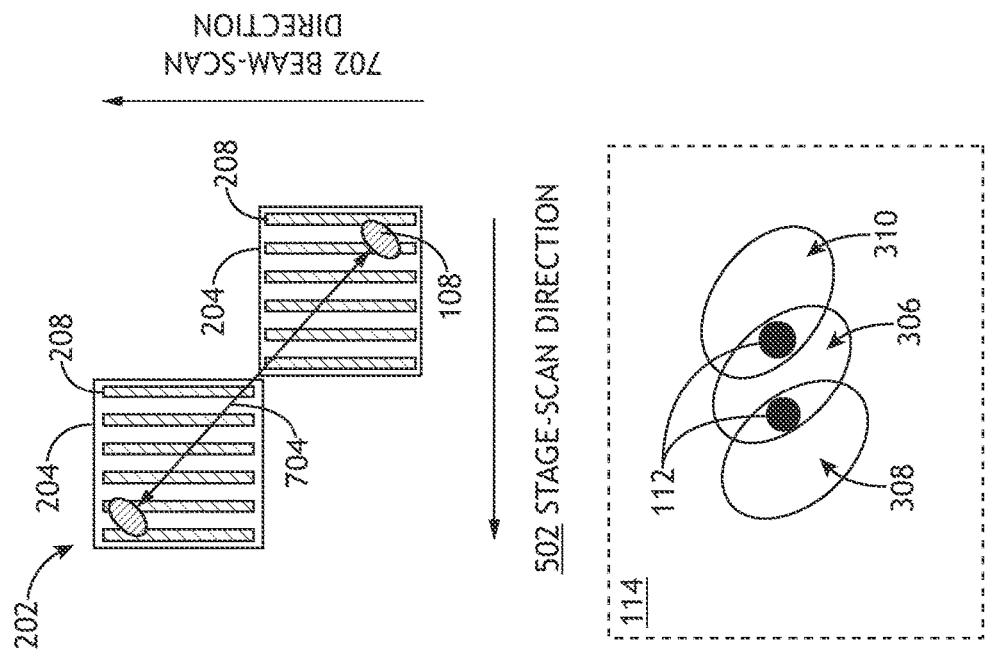
FIG. 7B is a top view of a second overlay target suitable for overlay measurements along the X direction with an illumination beam being scanned along the +Y direction in accordance with one or more embodiments of the present disclosure.
Figure 7A:
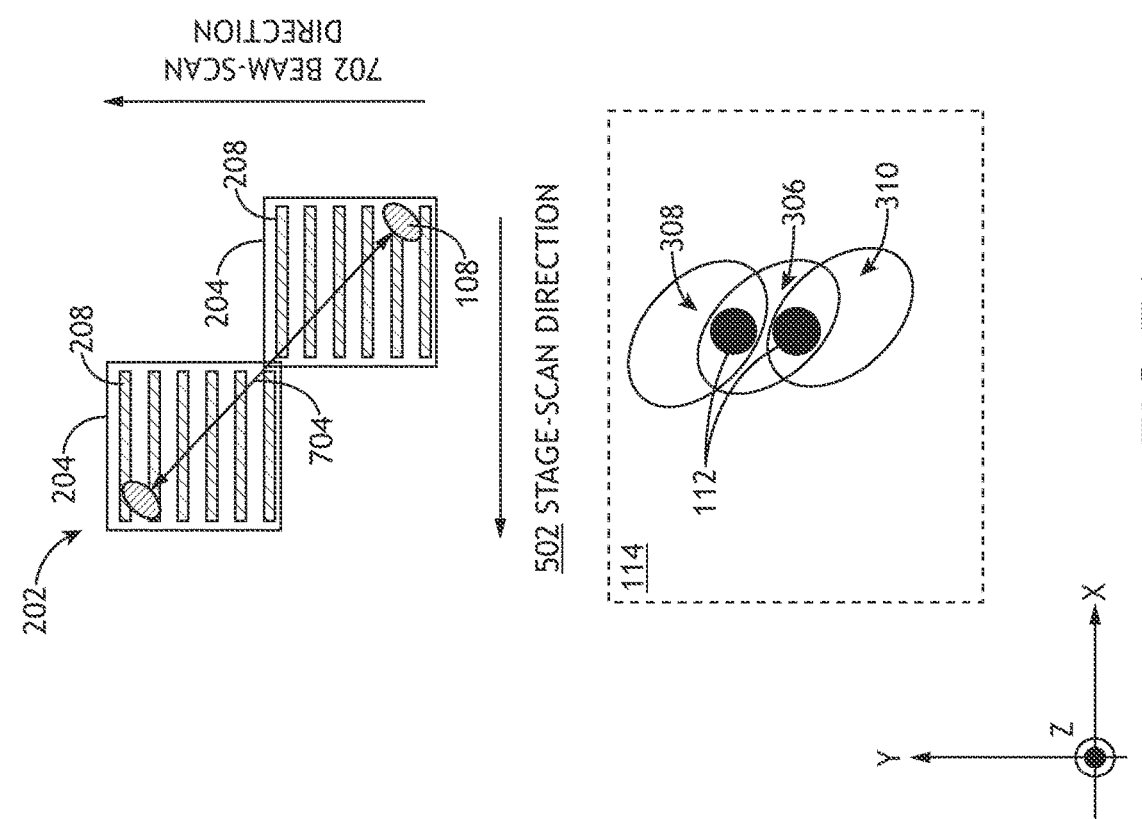
FIG. 7A is a top view of a first overlay target suitable for overlay measurements along the Y direction with an illumination beam being scanned along the +Y direction in accordance with one or more embodiments of the present disclosure.

FIGS. 7A-7D illustrate 1D overlay targets 202 suitable for overlay measurements along the X and Y directions in accordance with one or more embodiments of the present disclosure. FIG. 7A is a top view of a first overlay target 202 suitable for overlay measurements along the Y direction with an illumination beam 108 being scanned along the +Y direction in accordance with one or more embodiments of the present disclosure. FIG. 7B is a top view of a second overlay target 202 suitable for overlay measurements along the X direction with an illumination beam 108 being scanned along the +Y direction in accordance with one or more embodiments of the present disclosure. In FIGS. 7A and 7B, scanning speeds along the stage-scan direction 502 and the beam-scanning direction 702 may be selected such that an illumination beam 108 propagates across opposing corners of a cell 204 along a first diagonal direction 704. In this way, multiple cells 204 may be distributed along the first diagonal direction 704, which may increase the effective measurement area of the overlay target 202 and thus improve the overlay measurement.

FIGS. 7C and 7D illustrate similar overlay targets 202 suitable for beam scanning along the −Y direction. FIG. 7C is a top view of a first overlay target 202 suitable for overlay measurements along the Y direction with an illumination beam 108 being scanned along the −Y direction in accordance with one or more embodiments of the present disclosure. FIG. 7D is a top view of a second overlay target 202 suitable for overlay measurements along the X direction with an illumination beam 108 being scanned along the −Y direction in accordance with one or more embodiments of the present disclosure. As in FIGS. 7A and 7B, scanning speeds along the stage-scan direction 502 and the beam-scanning direction 702 may be selected such that an illumination beam 108 propagates across opposing corners of a cell 204 along a second diagonal direction 706 and multiple cells 204 may be distributed along the second diagonal direction 706.

Offset images in FIGS. 7A-7D depict the distribution of diffraction orders and the placement of the photodetectors 112 in the collection pupil plane 114 for measurement with the respective overlay targets 202. Additionally, FIGS. 7A-7D illustrate the use of elongating the illumination beam 108 in order to mitigate the impact of target roughness as described previously herein. As a non-limiting example, the illumination beam 108 in FIGS. 7A-7D is sized to 0.5×1 micrometer, which may be achieved by an oval pupil of 0.9×0.45 NA. Accordingly, the offset images illustrate the associated effect on the distribution of the diffraction orders in the collection pupil plane 114.

In one embodiment, an illumination beam 108 is oscillated along the beam-scanning direction 702 (e.g., by an oscillating deflector in the beam-scanning sub-system 118). In this regard, the illumination beam 108 may trace a path similar to a triangle wave on the sample 104. Accordingly, multiple overlay targets 202 (or multiple combinations of cells 204 thereof) may be distributed along the triangle wave pattern of the illumination beam 108 to facilitate successive measurements. For example, overlay targets 202 illustrated in FIGS. 7A and 7B may be interleaved with overlay targets 202 illustrated in FIGS. 7C and 7D. Continuing the non-limiting example of 10-micrometer square cells 204, this may be achieved by selecting a 10 cm/second speed along the stage-scan direction 502 and a 10 kHz resonant frequency along the beam-scanning direction 702.

Figure 8A:
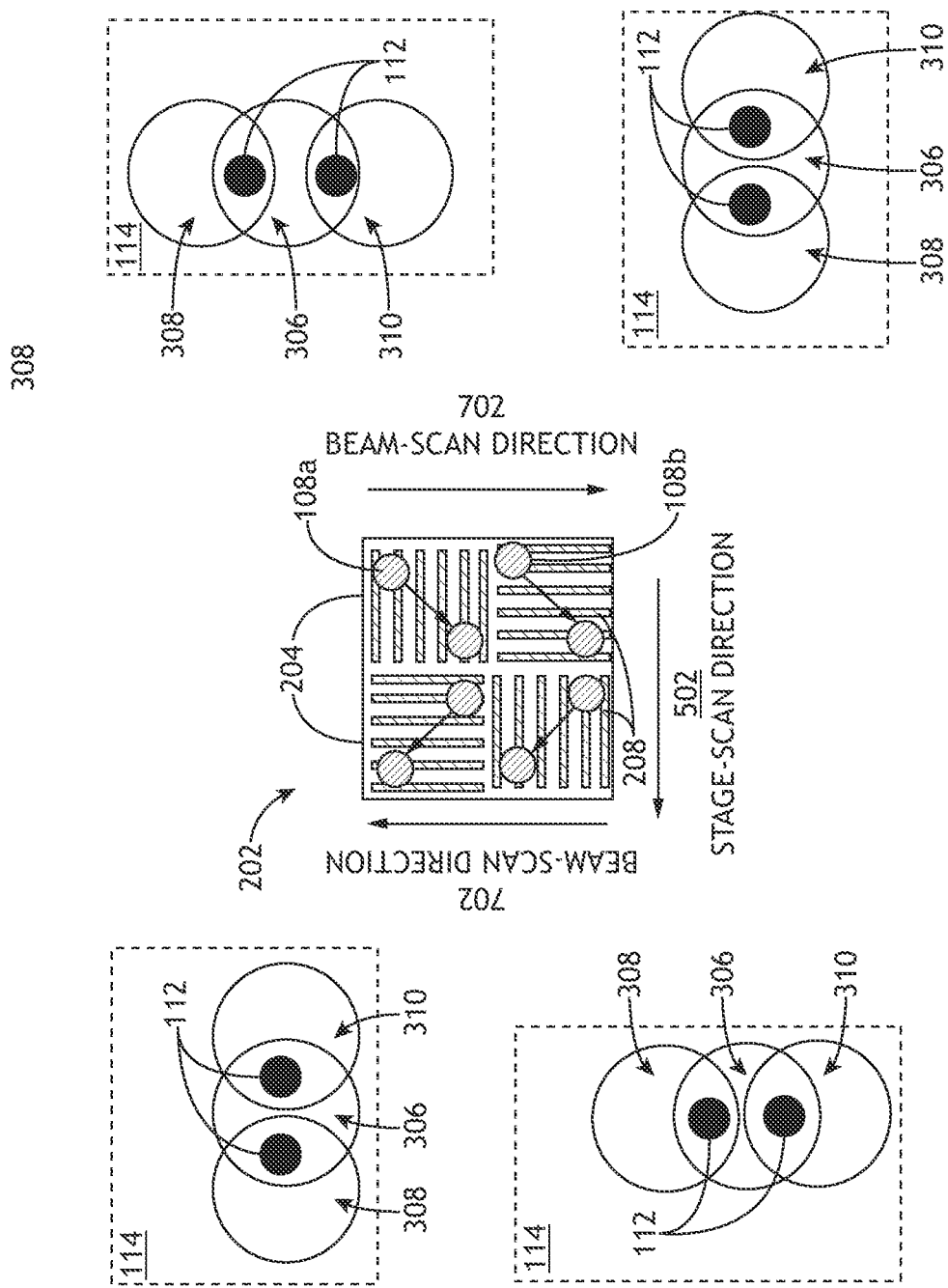
FIG. 8A is a top view of a first overlay target suitable for 2D overlay measurements with two parallel illumination beams in accordance with one or more embodiments of the present disclosure.
Figure 8B:
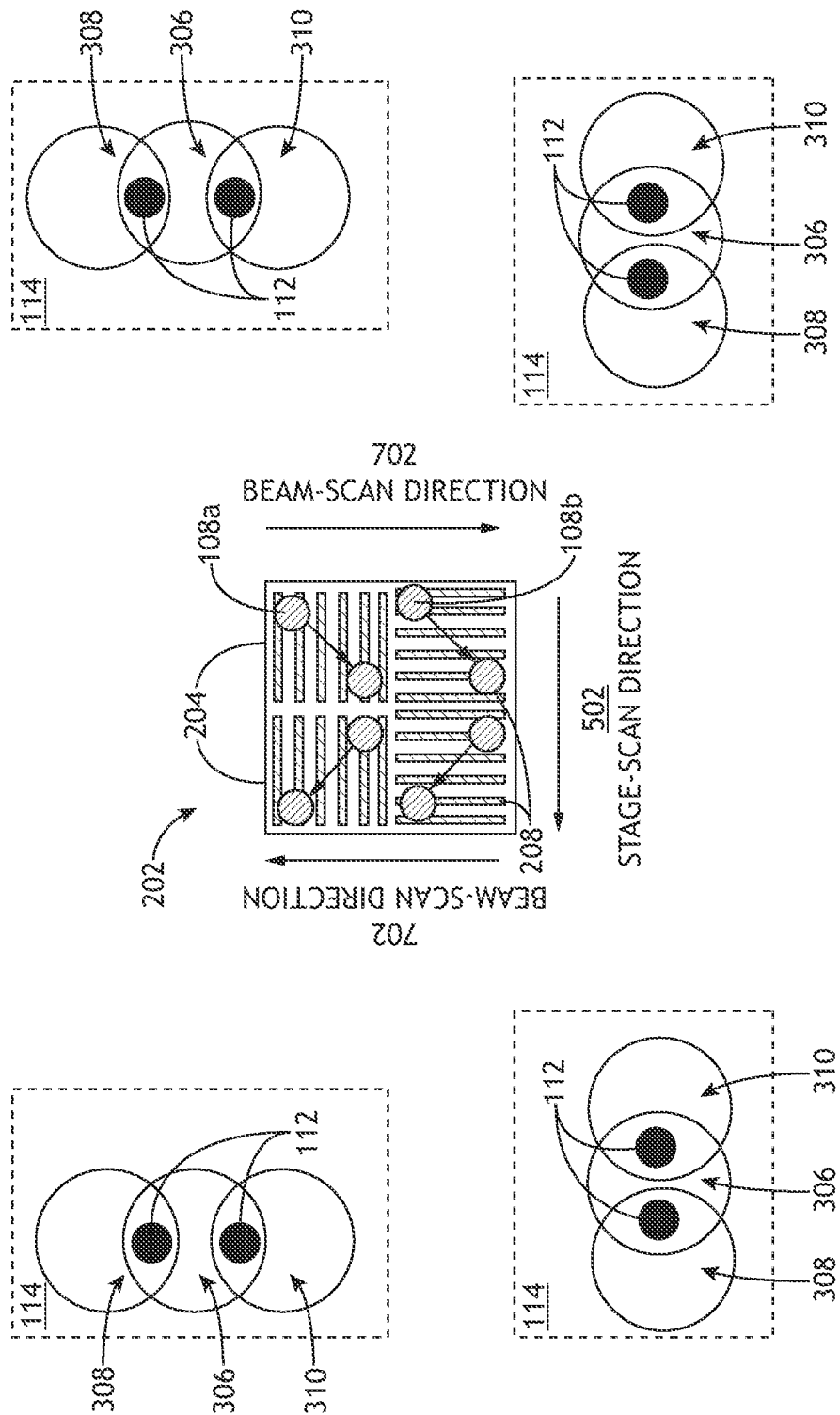
FIG. 8B is a top view of a second overlay target suitable for 2D overlay measurements with two parallel illumination beams in accordance with one or more embodiments of the present disclosure.

Referring now to FIGS. 8A and 8B, overlay targets 202 suitable for 2D overlay measurements using beam scanning are described in accordance with one or more embodiments of the present disclosure. FIG. 8A is a top view of a first overlay target 202 suitable for 2D overlay measurements with two parallel illumination beams 108 in accordance with one or more embodiments of the present disclosure. FIG. 8B is a top view of a second overlay target 202 suitable for 2D overlay measurements with two parallel illumination beams 108 in accordance with one or more embodiments of the present disclosure. In both FIGS. 8A and 8B, a first illumination beam 108a traces a triangle-wave path across cells 204 in a first row and a second illumination beam 108b traces a triangle-wave path across cells 204 in a second row. Continuing the non-limiting example of 10-micrometer square cells 204, this may be achieved by selecting a 10 cm/second speed along the stage-scan direction 502 and a 20 kHz resonant frequency along the beam-scanning direction 702.

Further, the offset images in FIGS. 8A and 8B illustrate the corresponding distributions of diffraction orders and the placement of photodetectors 112 in the collection pupil plane 114 associated with measurements of the various cells 204. It is noted that the illumination beams 108 are illustrated as circular in FIGS. 8A and 8B, but it should be understood that the illumination beams 108 may be elongated to mitigate noise associated with target roughness as described previously herein.

In FIG. 8A, cells 204 with a common direction of periodicity are diagonally distributed in the overlay target 202. However, it is contemplated herein that the signal strength of diffracted orders may depend on the polarization of the illumination beam 108 and the direction of periodicity. As described previously herein, in some embodiments, simultaneous measurements of multiple cells 204 with multiple illumination beams 108 (e.g., as illustrated by FIGS. 8A and 8B, as well as FIGS. 6A and 6B above) are implemented by separating the diffraction orders associated with the multiple illumination beams 108 into separate collection channels 144. This separation may be efficiently achieved by differentiating the illumination beams 108 by polarization, color, or some other parameter and providing corresponding elements in the collection sub-system 110 to separate the resulting diffraction orders (e.g., polarization filters, polarizing beamsplitters, spectral filters, spectral beamsplitters, or the like). However, the layout illustrated in FIG. 8A provides that each illumination beam 108 interrogates one X-direction cell 204 and one Y-direction cell 204, which may introduce disparities in the associated signals for the two illumination beams 108. In some embodiments, such disparities are mitigated algorithmically. In some embodiments, the optical configuration of each illumination beam 108 may be alternated or otherwise switched to provide for common measurement conditions for cells having a common direction of periodicity.

However, the overlay target 202 illustrated in FIG. 8B is arranged such that cells 204 with a common direction of periodicity are interrogated by common illumination beams 108. In this way, measurements of various cells 204 with a common direction of periodicity may be performed using common measurement conditions, which may improve the accuracy of the overlay measurement.

Figure 9:
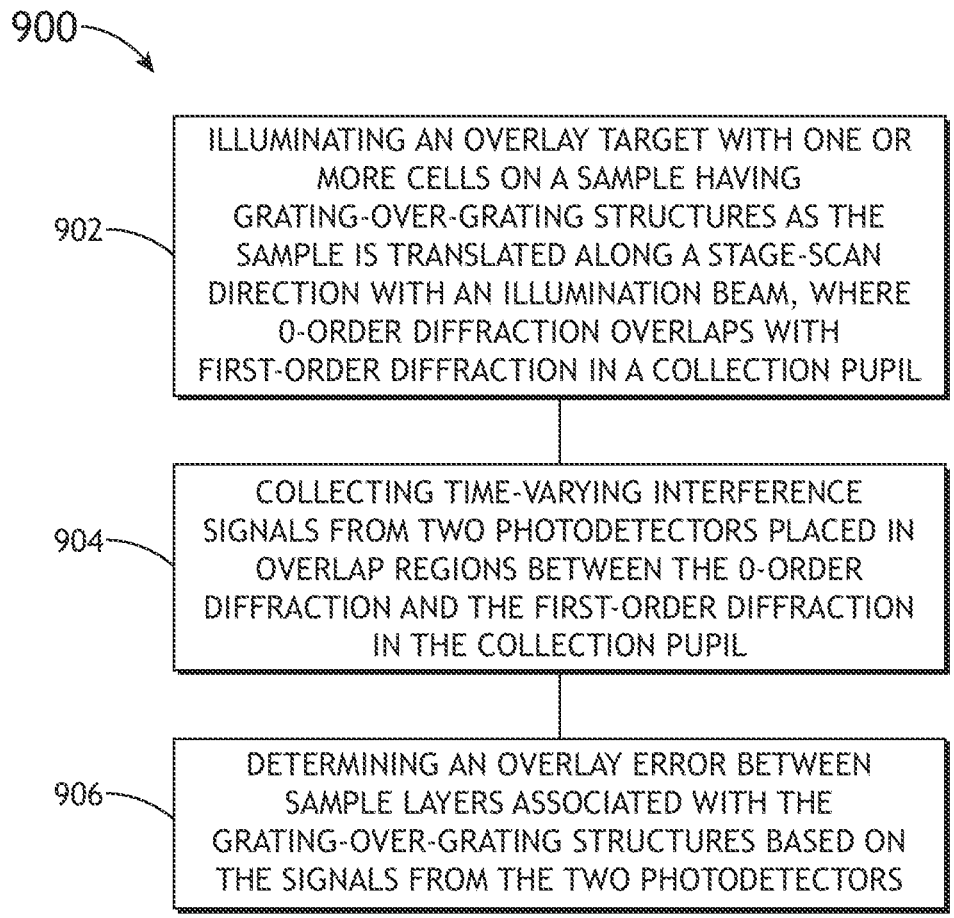
FIG. 9 is a flow diagram illustrating steps performed in a method for grey-mode scanning overlay metrology in accordance with one or more embodiments of the present disclosure.

FIG. 9 is a flow diagram illustrating steps performed in a method 900 for grey-mode scanning overlay metrology in accordance with one or more embodiments of the present disclosure. Applicant notes that the embodiments and enabling technologies described previously herein in the context of the system 100 should be interpreted to extend to the method 900. It is further noted, however, that the method 900 is not limited to the architecture of the system 100.

In one embodiment, the method 900 includes a step 902 of illuminating an overlay target with one or more cells on a sample having grating-over-grating structures as the sample is translated along a stage-scan direction with an illumination beam, where 0-order diffraction overlaps with first-order diffraction in a collection pupil.

In another embodiment, the method 900 includes a step 904 of collecting time-varying interference signals from two photodetectors placed in overlap regions between the 0-order diffraction and the first-order diffraction in the collection pupil.

In another embodiment, the method 900 includes a step 906 of determining an overlay error between sample layers associated with the grating-over-grating structures based on the signals from the two photodetectors. For example, an overlay error along a direction of periodicity of the grating-over-grating structures may be proportional to a phase difference between the time-varying interference signals from the two photodetectors. The phase difference may be determined using any technique known in the art including, but not limited to, phase-locking techniques applied to the two time-varying interference signals.

It is contemplated herein that the method 900 may be applied to a wide variety of overlay target designs suitable for 1D or 2D metrology measurements. In some embodiments, the method 900 includes simultaneously scanning multiple illumination beams and collecting the associated overlapping diffraction orders for parallel measurements. In some embodiments, the method 900 includes scanning one or more illumination beams along a beam-scan direction different than the stage-scan direction to provide a diagonal or triangle-wave path across the sample. In this regard, cells having grating-over-grating structures with different directions of periodicity may be efficiently interrogated by a common illumination beam in a measurement swath.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:
   an illumination sub-system comprising:
      an illumination source configured to generate an illumination beam;
      one or more illumination optics configured to direct the illumination beam to an overlay target on a sample as the sample is scanned along a stage-scan direction by a translation stage, wherein the overlay target includes one or more cells having a grating-over-grating structure with periodicity along the stage-scan direction, wherein the grating-over-grating structures include first-layer grating features on a first layer of the sample and second-layer grating features on a second layer of the sample in an overlapping region;
   a collection sub-system comprising:
      an objective lens;
      a first photodetector located in a pupil plane at a location of overlap between 0-order diffraction from the overlay target and +1-order diffraction from the overlay target; and
      a second photodetector located in a pupil plane at a location of overlap between 0-order diffraction from the overlay target and −1-order diffraction from the overlay target; and
   a controller communicatively coupled to the first and second photodetectors, the controller including one or more processors configured to execute program instructions causing the one or more processors to:
      receive time-varying interference signals from the first and second photodetectors as the overlay target is scanned along the stage-scan direction; and
      determine an overlay error between the first and second layers of the sample along the stage-scan direction based on the time-varying interference signals.

2. The overlay metrology system of claim 1, wherein the first and second photodetectors comprise:
   phase-locked photodetectors locked to a frequency of the time-varying interference signals, wherein the one or more processors are further configured to execute program instructions causing the one or more processors to:
      extract at least one of intensity or phase information associated with the +1-order diffraction and the −1-order diffraction using a phase locking technique; and
      determine the overlay error between the first and second layers of the sample based on the at least one of intensity or phase information.

3. The overlay metrology system of claim 1, wherein a spot size of the illumination lobe on the overlay target is elongated along a direction orthogonal to the stage-scan direction to provide target noise averaging.

4. The overlay metrology system of claim 1, wherein the illumination beam comprises:
   a spatially coherent illumination beam.

5. An overlay metrology system comprising:
   an illumination sub-system comprising:
      a first illumination channel and a second illumination channel for illuminating an overlay target on a sample with a first illumination beam and a second illumination beam as the sample is scanned along a stage-scan direction by a translation stage, wherein the overlay target includes one or more first cells having a grating-over-grating structure with periodicity along a first direction and one or more second cells having a grating-over-grating structure with periodicity along a second direction orthogonal to the first direction, wherein the stage-scan direction is angled with respect to the first direction and the second direction, wherein a particular grating-over-grating structure includes first-layer grating features on a first layer of the sample and second-layer grating features on a second layer of the sample in an overlapping region, wherein the first and second illumination channels illuminate different cells of the overlay target separated along a direction orthogonal to the stage-scan direction;
   a collection sub-system comprising:
      an objective lens;
      a first detection channel and a second detection channel associated with the first illumination channel and the second illumination channel, respectively, wherein a particular detection channel comprises:
         a first photodetector located in a pupil plane at a location of overlap between 0-order diffraction from the overlay target and +1-order diffraction from the overlay target; and
         a second photodetector located in a pupil plane at a location of overlap between 0-order diffraction from the overlay target and −1-order diffraction from the overlay target; and
   a controller communicatively coupled to the first and second photodetectors, the controller including one or more processors configured to execute program instructions causing the one or more processors to:
      receive time-varying interference signals from the first and second photodetectors of each of the first and second detection channels as the overlay target is scanned along the measurement direction; and
      determine an overlay error between the first and second layers of the sample along the first and second directions based on the time-varying interference signals.

6. The overlay metrology system of claim 5, wherein the first and second photodetectors of each of the first and second detection channels comprise:
   phase-locked photodetectors locked to a frequency of the time-varying interference signals, wherein the one or more processors are further configured to execute program instructions causing the one or more processors to:
      extract at least one of intensity or phase information associated with the +1-order diffraction and the −1-order diffraction using a phase locking technique; and
      determine the overlay error between the first and second layers of the sample based on the at least one of intensity or phase information.

7. The overlay metrology system of claim 5, wherein the first illumination beam has a polarization orthogonal to a polarization of the second illumination beam.

8. The overlay metrology system of claim 5, wherein the first illumination beam has a different wavelength than the second illumination beam.

9. The overlay metrology system of claim 5, wherein the first and second illumination beams comprise:
   spatially coherent illumination beams.

10. The overlay metrology system of claim 5, wherein the one or more first cells of the overlay target are distributed along the stage-scan direction and are aligned with the first illumination channel, wherein the one or more second cells of the overlay target are distributed along the stage-scan direction and are aligned with the second illumination channel.

11. The overlay metrology system of claim 5, wherein the one or more first cells of the overlay target are distributed along a diagonal direction with respect to the stage-scan direction, wherein one of the one or more first cells is aligned with the first illumination channel and one of the one or more first cells is aligned with the second illumination channel, wherein the one or more second cells of the overlay target are distributed along a diagonal direction with respect to the stage-scan direction, wherein one of the one or more second cells is aligned with the first illumination channel and one of the one or more second cells is aligned with the second illumination channel.

12. An overlay metrology system comprising:
   an illumination sub-system comprising:
      an illumination source configured to generate an illumination beam; and
      a scan mirror configured to scan the illumination beam along a beam-scan direction across an overlay target on a sample as the sample is translated along a stage-scan direction orthogonal to the beam-scan direction by a translation stage, wherein the overlay target includes one or more cells having a grating-over-grating structure with periodicity along a measurement direction, wherein the measurement direction corresponds to the beam-scan direction or the stage-scan direction, wherein the grating-over-grating structures include first-layer grating features on a first layer of the sample and second-layer grating features on a second layer of the sample in an overlapping region;
   a collection sub-system comprising:
      an objective lens;
      a first photodetector located in a pupil plane at a location of overlap between 0-order diffraction from the overlay target and +1-order diffraction from the overlay target; and
      a second photodetector located in a pupil plane at a location of overlap between 0-order diffraction from the overlay target and −1-order diffraction from the overlay target; and
   a controller communicatively coupled to the first and second photodetectors, the controller including one or more processors configured to execute program instructions causing the one or more processors to:
      receive time-varying interference signals from the first and second photodetectors as the overlay target is scanned along the measurement direction; and
      determine an overlay error between the first and second layers of the sample along the measurement direction based on the time-varying interference signals.

13. The overlay metrology system of claim 12, wherein the first and second photodetectors comprise:
   phase-locked photodetectors locked to a frequency of the time-varying interference signals, wherein the one or more processors are further configured to execute program instructions causing the one or more processors to:
      extract at least one of intensity or phase information associated with the +1-order diffraction and the −1-order diffraction using a phase locking technique; and
      determine the overlay error between the first and second layers of the sample based on the at least one of intensity or phase information.

14. The overlay metrology system of claim 12, wherein a spot size of the illumination lobe on the overlay target is elongated along a direction orthogonal to the measurement direction to provide target noise averaging.

15. The overlay metrology system of claim 12, wherein the illumination beam comprises:
   a spatially coherent illumination beam.

16. An overlay metrology system comprising:
   an illumination sub-system comprising:
      a first illumination channel and a second illumination channel for illuminating an overlay target on a sample with a first illumination beam and a second illumination beam as the sample is scanned along a stage-scan direction by a translation stage, respectively, wherein the overlay target includes one or more first cells having a grating-over-grating structure with periodicity along a first direction and one or more second cells having a grating-over-grating structure with periodicity along a second direction orthogonal to the first direction, wherein the stage-scan direction corresponds to the first direction or the second direction, wherein a particular grating-over-grating structure includes first-layer grating features on a first layer of the sample and second-layer grating features on a second layer of the sample in an overlapping region, wherein the first and second illumination channels illuminate different cells of the overlay target separated along a direction orthogonal to the stage-scan direction; and
      one or more beam-scanners to scan the first and second illumination beams along a beam-scan direction orthogonal to the stage-scan direction while the sample is scanned along the stage-scan direction; and
   a collection sub-system comprising:
      an objective lens; and
      a first detection channel and a second detection channel associated with the first illumination channel and the second illumination channel, respectively, wherein a particular detection channel comprises:
         a first photodetector located in a pupil plane at a location of overlap between 0-order diffraction from the overlay target and +1-order diffraction from the overlay target; and
         a second photodetector located in a pupil plane at a location of overlap between 0-order diffraction from the overlay target and −1-order diffraction from the overlay target; and
      a controller communicatively coupled to the first and second photodetectors, the controller including one or more processors configured to execute program instructions causing the one or more processors to:
         receive time-varying interference signals from the first and second photodetectors of each of the first and second detection channels as the overlay target is scanned along the measurement direction; and
         determine an overlay error between the first and second layers of the sample along the first and second directions based on the time-varying interference signals.

17. The overlay metrology system of claim 16, wherein the first and second photodetectors of each of the first and second detection channels comprise:
   phase-locked photodetectors locked to a frequency of the time-varying interference signals, wherein the one or more processors are further configured to execute program instructions causing the one or more processors to:
- extract at least one of intensity or phase information associated with the +1-order diffraction and the −1-order diffraction using a phase locking technique; and
- determine the overlay error between the first and second layers of the sample based on the at least one of intensity or phase information.

18. The overlay metrology system of claim 16, wherein the first beam-scan direction is the second beam-scan direction.

19. The overlay metrology system of claim 16, wherein the first beam-scan direction is opposite to the second beam-scan direction.

20. The overlay metrology system of claim 16, wherein the first illumination beam has a polarization orthogonal to a polarization of the second illumination beam.

21. The overlay metrology system of claim 16, wherein the first illumination beam has a different wavelength than the second illumination beam.

22. The overlay metrology system of claim 16, wherein the first and second illumination beams comprise:
- spatially coherent illumination beams.

23. The overlay metrology system of claim 16, wherein the one or more first cells of the overlay target are distributed along the stage-scan direction and are aligned with the first illumination channel, wherein the one or more second cells of the overlay target are distributed along the stage-scan direction and are aligned with the second illumination channel.

24. The overlay metrology system of claim 16, wherein the one or more first cells of the overlay target are distributed along a diagonal direction with respect to the stage-scan direction, wherein one of the one or more first cells is aligned with the first illumination channel and one of the one or more first cells is aligned with the second illumination channel, wherein the one or more second cells of the overlay target are distributed along a diagonal direction with respect to the stage-scan direction, wherein one of the one or more second cells is aligned with the first illumination channel and one of the one or more second cells is aligned with the second illumination channel.

* * * * *